United States Patent
Citta et al.

(10) Patent No.: US 8,848,781 B2
(45) Date of Patent: Sep. 30, 2014

(54) APPARATUS AND METHOD FOR ENCODING AND DECODING SIGNALS

(75) Inventors: Richard W. Citta, Oak Park, IL (US); Scott M. LoPresto, Chicago, IL (US)

(73) Assignee: Thomson Licensing, Boulogne (FR)

( * ) Notice: Subject to any disclaimer, the term of this patent is extended or adjusted under 35 U.S.C. 154(b) by 156 days.

(21) Appl. No.: 12/599,734

(22) PCT Filed: May 16, 2008

(86) PCT No.: PCT/US2008/006332
§ 371 (c)(1),
(2), (4) Date: Nov. 11, 2009

(87) PCT Pub. No.: WO2008/144002
PCT Pub. Date: Nov. 27, 2008

(65) Prior Publication Data
US 2010/0238995 A1  Sep. 23, 2010

Related U.S. Application Data

(60) Provisional application No. 60/930,683, filed on May 16, 2007, provisional application No. 60/930,591, filed on May 17, 2007, provisional application No. 60/936,360, filed on Jun. 20, 2007, provisional application No. 60/958,581, filed on Jul. 6, 2007.

(51) Int. Cl.
*H04N 7/12* (2006.01)

(52) U.S. Cl.
USPC .................................................... 375/240.01

(58) Field of Classification Search
USPC ..................................................... 375/240.01
IPC ....................................................... H04N 7/12
See application file for complete search history.

(56) References Cited

U.S. PATENT DOCUMENTS

| 3,652,998 A | 3/1972 | Forney, Jr. |
| 3,873,920 A | 3/1975 | Apple et al. |

(Continued)

FOREIGN PATENT DOCUMENTS

| CA | 2534435 | 3/2005 |
| CN | 1575549 | 2/2005 |

(Continued)

OTHER PUBLICATIONS

Anonymous: "ATSC Digital Television Standard Part 2" RF/Transmission System Characteristics (A/53, Part 2:2007) Internet Article, Retrieved on Sep. 9, 2008 (Figure 6.1 & Figure 6.2).

(Continued)

*Primary Examiner* — Dave Czekaj
*Assistant Examiner* — Tracy Li
(74) *Attorney, Agent, or Firm* — Robert D. Shedd; Vincent E. Duffy; Michael A. Pugel

(57) ABSTRACT

New capabilities will allow conventional broadcast transmission to be available to mobile devices. A method is described including the steps of receiving a packet of data having a data payload and a header, byte code encoding the data in the packet, and altering information in the header in response to the byte code encoding. An apparatus is described including an encoder receiving a packet of data and encoding the data using a byte code encoding process and a header modifier altering information in the header in response to the byte code encoding. A decoding apparatus is described including a packet identifier receiving a plurality of data packets, and identifying a data packet based on information in the header, a byte code decoder decoding the identified data packet using a byte code decoding process, and a Reed-Solomon decoder decoding at least the decoded identified data packet using a Reed-Solomon decoding process.

11 Claims, 13 Drawing Sheets

(56) References Cited

U.S. PATENT DOCUMENTS

| | | | |
|---|---|---|---|
| 4,677,625 A | 6/1987 | Betts et al. |
| 5,012,491 A | 4/1991 | Iwasaki |
| 5,087,975 A | 2/1992 | Citta et al. |
| 5,369,641 A | 11/1994 | Dodt et al. |
| 5,398,073 A * | 3/1995 | Wei | 348/487 |
| 5,438,369 A | 8/1995 | Citta et al. |
| 5,452,009 A | 9/1995 | Citta |
| 5,534,938 A | 7/1996 | Citta et al. |
| 5,572,532 A | 11/1996 | Fimoff et al. |
| 5,600,677 A | 2/1997 | Citta et al. |
| 5,629,958 A | 5/1997 | Willming |
| 5,636,251 A | 6/1997 | Citta et al. |
| 5,687,182 A | 11/1997 | Shikakura |
| 5,809,242 A | 9/1998 | Shaw et al. |
| 5,978,855 A | 11/1999 | Metz et al. |
| 6,079,041 A | 6/2000 | Kunisa et al. |
| 6,407,993 B1 | 6/2002 | Moulsley |
| 6,559,894 B2 | 5/2003 | Omura et al. |
| 6,563,436 B2 | 5/2003 | Fimoff et al. |
| 6,614,847 B1 | 9/2003 | Das et al. |
| 6,625,775 B1 | 9/2003 | Kim |
| 6,687,310 B1 | 2/2004 | Fimoff et al. |
| 6,725,411 B1 | 4/2004 | Gerlach et al. |
| 6,754,170 B1 | 6/2004 | Ward |
| 6,762,698 B2 | 7/2004 | Bretl et al. |
| 6,765,508 B2 | 7/2004 | Bretl et al. |
| 6,771,197 B1 | 8/2004 | Yedidia et al. |
| 6,806,816 B2 | 10/2004 | Fimoff |
| 6,851,085 B2 | 2/2005 | Kim et al. |
| 6,861,964 B2 | 3/2005 | Bretl et al. |
| 6,865,712 B2 | 3/2005 | Becker et al. |
| 6,924,753 B2 | 8/2005 | Bretl et al. |
| 6,985,092 B2 | 1/2006 | Bretl et al. |
| 6,987,543 B1 | 1/2006 | Mogre et al. |
| 6,996,133 B2 | 2/2006 | Bretl et al. |
| 7,016,409 B2 | 3/2006 | Unger |
| 7,042,949 B1 | 5/2006 | Omura et al. |
| 7,046,694 B2 | 5/2006 | Kumar |
| 7,085,324 B2 * | 8/2006 | Choi et al. | 375/240.27 |
| 7,110,048 B2 | 9/2006 | Weiss |
| 7,187,698 B2 | 3/2007 | Bretl et al. |
| 7,194,047 B2 | 3/2007 | Strolle et al. |
| 7,197,685 B2 | 3/2007 | Limberg |
| 7,203,165 B1 | 4/2007 | Kowalewski |
| 7,215,714 B2 | 5/2007 | Bretl et al. |
| 7,260,109 B1 | 8/2007 | Ovard et al. |
| 7,337,386 B2 | 2/2008 | Chang et al. |
| 7,346,107 B2 | 3/2008 | Choi et al. |
| 7,675,994 B2 | 3/2010 | Gaddam et al. |
| 7,712,011 B2 | 5/2010 | Kim et al. |
| 7,715,491 B2 | 5/2010 | Yu et al. |
| 7,822,139 B2 | 10/2010 | Simon |
| 7,860,128 B2 | 12/2010 | Niu et al. |
| 7,933,365 B2 | 4/2011 | Choi et al. |
| 7,983,354 B2 | 7/2011 | Park et al. |
| 8,094,727 B2 | 1/2012 | Hong et al. |
| 8,149,939 B2 | 4/2012 | Limberg |
| 8,151,174 B2 | 4/2012 | Betts |
| 8,495,695 B2 | 7/2013 | Kim et al. |
| 2001/0024457 A1 | 9/2001 | Barry et al. |
| 2001/0050926 A1 | 12/2001 | Kumar |
| 2001/0055342 A1 | 12/2001 | Fimoff |
| 2002/0027947 A1 | 3/2002 | Kanterakis et al. |
| 2002/0040460 A1 | 4/2002 | Choi et al. |
| 2002/0053049 A1 | 5/2002 | Shiomoto et al. |
| 2002/0054634 A1 | 5/2002 | Martin et al. |
| 2002/0154247 A1 | 10/2002 | Ghosh et al. |
| 2002/0154248 A1 | 10/2002 | Wittig et al. |
| 2002/0172275 A1 | 11/2002 | Birru |
| 2002/0181581 A1 | 12/2002 | Birru et al. |
| 2002/0191712 A1 | 12/2002 | Gaddam et al. |
| 2002/0194570 A1 | 12/2002 | Birru et al. |
| 2003/0012290 A1 | 1/2003 | Fimoff et al. |
| 2003/0021341 A1 | 1/2003 | Vigil et al. |
| 2003/0039318 A1 | 2/2003 | Tong et al. |
| 2003/0041256 A1 | 2/2003 | Wee et al. |
| 2003/0081692 A1 | 5/2003 | Kwan et al. |
| 2003/0099303 A1 | 5/2003 | Birru et al. |
| 2003/0103575 A1 | 6/2003 | Birru et al. |
| 2003/0108129 A1 | 6/2003 | Voglewede et al. |
| 2003/0112879 A1 | 6/2003 | Antia et al. |
| 2003/0128746 A1 | 7/2003 | Lerner et al. |
| 2003/0140345 A1 | 7/2003 | Fisk et al. |
| 2003/0154441 A1 | 8/2003 | Nieminen |
| 2003/0227906 A1 | 12/2003 | Hallman |
| 2003/0227913 A1 | 12/2003 | Hallman et al. |
| 2003/0227943 A1 | 12/2003 | Hallman |
| 2004/0047367 A1 | 3/2004 | Mammen |
| 2004/0090997 A1 | 5/2004 | Choi et al. |
| 2005/0018691 A1 | 1/2005 | Riedl et al. |
| 2005/0059436 A1 | 3/2005 | Addy et al. |
| 2005/0138521 A1 | 6/2005 | Suzuki et al. |
| 2005/0152411 A1 | 7/2005 | Breti et al. |
| 2005/0160347 A1 | 7/2005 | Kim et al. |
| 2005/0180369 A1 | 8/2005 | Hansen et al. |
| 2005/0184887 A1 | 8/2005 | Jaffe et al. |
| 2005/0193408 A1 | 9/2005 | Sull et al. |
| 2005/0193425 A1 | 9/2005 | Sull et al. |
| 2005/0203927 A1 | 9/2005 | Sull et al. |
| 2005/0204385 A1 | 9/2005 | Sull et al. |
| 2005/0210145 A1 | 9/2005 | Kim et al. |
| 2005/0276259 A1 | 12/2005 | Nakabayashi et al. |
| 2006/0064716 A1 | 3/2006 | Sull et al. |
| 2006/0104348 A1 | 5/2006 | Chen et al. |
| 2006/0212782 A1 | 9/2006 | Li |
| 2006/0212902 A1 | 9/2006 | Seo et al. |
| 2006/0244865 A1 | 11/2006 | Simon |
| 2006/0246836 A1 | 11/2006 | Simon |
| 2006/0253890 A9 | 11/2006 | Park et al. |
| 2007/0002871 A1 | 1/2007 | Pekonen et al. |
| 2007/0025450 A1 | 2/2007 | Jim |
| 2007/0076584 A1 | 4/2007 | Kim et al. |
| 2007/0076586 A1 | 4/2007 | Kim et al. |
| 2007/0094567 A1 | 4/2007 | Park et al. |
| 2007/0116152 A1 | 5/2007 | Thesling |
| 2007/0140271 A1 | 6/2007 | Amante et al. |
| 2007/0140369 A1 | 6/2007 | Limberg |
| 2007/0153914 A1 | 7/2007 | Hannuksela et al. |
| 2007/0168844 A1 | 7/2007 | Jeong et al. |
| 2007/0183525 A1 | 8/2007 | Park et al. |
| 2007/0195889 A1 | 8/2007 | Hong et al. |
| 2007/0211661 A1 | 9/2007 | Tee et al. |
| 2007/0211671 A1 | 9/2007 | Cha |
| 2007/0211769 A1 | 9/2007 | Lee et al. |
| 2007/0230607 A1 | 10/2007 | Yu et al. |
| 2007/0256001 A1 | 11/2007 | Suzuki et al. |
| 2007/0277210 A1 | 11/2007 | Yousef |
| 2008/0002765 A1 * | 1/2008 | Song et al. | 375/240.01 |
| 2008/0101493 A1 | 5/2008 | Niu et al. |
| 2008/0112502 A1 | 5/2008 | Limberg |
| 2009/0128711 A1 | 5/2009 | Kim et al. |

FOREIGN PATENT DOCUMENTS

| | | |
|---|---|---|
| CN | 1757190 | 4/2006 |
| EP | 0822722 | 2/1998 |
| EP | 0853407 | 7/1998 |
| EP | 0999709 | 5/2000 |
| EP | 1237319 | 9/2002 |
| EP | 1276288 | 1/2003 |
| EP | 1437910 | 7/2004 |
| EP | 1528702 | 5/2005 |
| EP | 1533727 | 5/2005 |
| EP | 1657835 | 5/2006 |
| EP | 1693981 | 8/2006 |
| JP | 11196072 | 7/1999 |
| JP | 2001274774 | 10/2001 |
| JP | 200432467 | 1/2004 |
| JP | 2004328356 | 11/2004 |
| JP | 2005328334 | 11/2005 |
| JP | 2005328397 | 11/2005 |
| JP | 2007214856 | 8/2007 |
| JP | 2009524944 | 7/2009 |
| KR | 100277764 | 1/2001 |

(56) References Cited

FOREIGN PATENT DOCUMENTS

| | | |
|---|---|---|
| KR | 1020020027293 | 4/2002 |
| WO | WO9851111 | 11/1998 |
| WO | WO0018055 | 3/2000 |
| WO | WO0035136 | 6/2000 |
| WO | WO0191407 | 11/2001 |
| WO | WO0221784 | 3/2002 |
| WO | WO02100026 | 12/2002 |
| WO | WO2004015998 | 2/2004 |
| WO | WO2004023818 | 3/2004 |
| WO | WO2005020576 | 3/2005 |
| WO | WO2005115001 | 12/2005 |
| WO | WO2005122574 | 12/2005 |
| WO | WO2006104519 | 10/2006 |
| WO | WO2006126841 | 11/2006 |
| WO | WO2007/024275 | 3/2007 |
| WO | WO2007046674 | 4/2007 |
| WO | WO2007099978 | 7/2007 |
| WO | WO2008014522 | 1/2008 |
| WO | WO2008144001 | 11/2008 |
| WO | WO2008144002 | 11/2008 |
| WO | WO2008144003 | 11/2008 |
| WO | WO2008144004 | 11/2008 |
| WO | WO2008144005 | 11/2008 |

OTHER PUBLICATIONS

Anonymous: "ATSC Recommended Practice Program and System Information Protocol Implementation Guidelines for Broadcasters" Internet Article—Retrieved from Internet on Sep. 12, 2008 (pp. 16/17. whole doc).

Richer et al., "The ATSC Digital Television System," Proceedings of the IEEE, vol. 94, No. 1, Jan. 2006, pp. 37-43.

3rd Generation Partnership Project (3GPP); Technical Specification Group Radio Access Network Multiplexing and Channel Coding (FDD) Oct. 1, 1999 (pp. 12&13).

ATSC STD., "A/53: ATSC Digital Television Standard, Parts 1-6, 2007," Advanced Television Systems Committee, Inc., Jan. 3, 2007, 136 pages.

"ATSC Digital Television Standard, Doc. A/53," ATSC Digital Television Standard, Apr. 12, 1995, pp. 1-74.

Clark et. al., "Error Correction Coding for Digital Communications", Chapter 2 Group Code pp. 50-61, Jun. 30, 1981.

Davic, "Lower Layer Protocols and Physical Interfaces", Digital Audio-Visual Council, DAVIC 1.3.1 Specification Part 8, 1998.

Delay, "Broadband Data Delivery Over Television Networks", Digital and Computational Video, Proceedings, Feb. 8-9, 2001, Piscataway, NJ, pp. 36-43.

ETSI: "DVB-H Implementation Guidelines," DVB BlueBook Document A092 Rev. 2, May 2007, Internet Citation retrieved May 31, 2007, pp. 1-112.

ISO/IEC "Transport Stream Packet Layer", ISO/IEC 13818-1, ITU-T Rec. H.222.0, 1996.

Jacobsmeyer, "Introduction to Error-Control Coding", Pericle Communications Col, Internet Article, 2004.

Kratochvil et al., "DVB-H Standard and Testing of its Mobile Terminals," Radioelektronika, 17th International Conference, Brno, Czech Republic, Apr. 24-25, 2007, IEEE Apr. 24, 2007, pages.

Lehtoranta et al.:"Detecting Corrupted Intra Macroblocks in H.263 Video," IEEE, 2002, pp. 33-36.

Max, OFDM-UWB Physical Layer Emulation for Event-Based MAC Simulation, 17th Annual IEEE International Symposium (PIMRC'06), pp. 1-6.

Park et al.:"Supplementary Reference Sequece VSB System," IEEE, 3.2-2, 2007.

Roweis, "Equivalent Codes & Systematic Forms", Internet Article, Nov. 9, 2005.

Seshadri et al., "Channel Coding for Cochannel Interference Suppression in Wireless Communication Systems", Internet Article, Retrieved on Sep. 9, 2008.

Simpson, "Video Over IP, A Practical Guide to Technology and Applications", Elsevier-Focal Press, 2006, pp. 259-265.

Sun et al.:"Global Motion Vector Coding (GMVC),"ITU-Telecommunication Standardization Sector, doc. VCEG-O20, Dec. 4, 2001, pp. 1-6.

Tang et al., "Viterbi Decoder for High-Speed Ultra-Wideband Communication Systems", ICASSP 2005, 2005 IEEE.

De Castro, Fernando CC, et al. "8-VSB channel coding analysis for DTV broadcast." Consumer Electronics, IEEE Transactions on 46.3 (2000): 539-547.

\* cited by examiner

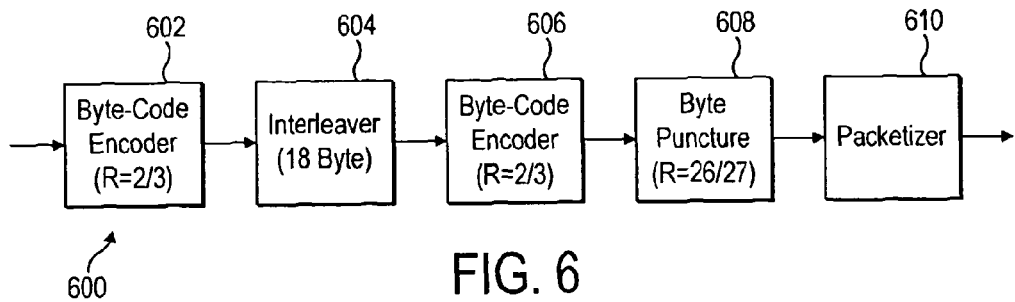
FIG. 6
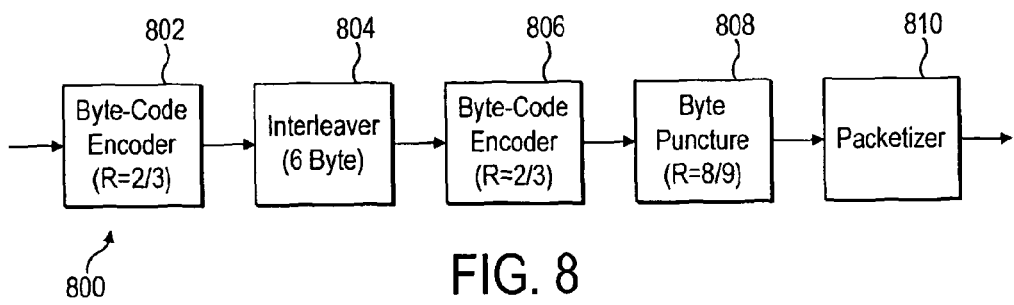
FIG. 7
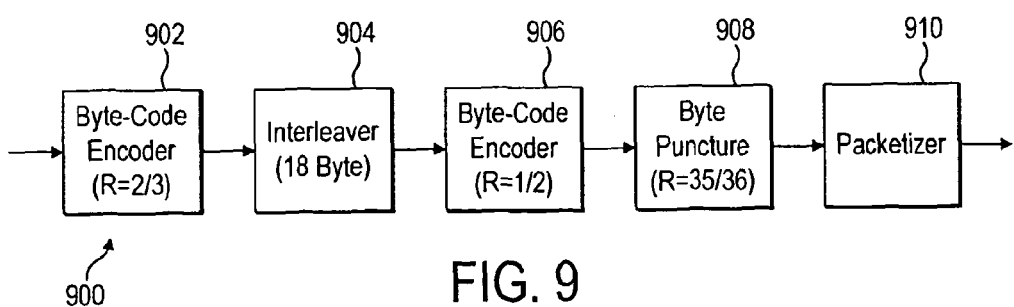
FIG. 8
FIG. 9

APPARATUS AND METHOD FOR ENCODING AND DECODING SIGNALS

CROSS REFERENCE TO RELATED APPLICATION

This application claims the benefit under 35 U.S.C. §119 of provisional application 60/930,683 filed in the United States on May 16, 2007, provisional application 60/930,591 filed in the United States on May 17, 2007, provisional application 60/936,360 filed in the United States on Jun. 20, 2007, and provisional application 60/958,581 filed in the United States on Jul. 6, 2007.

FIELD OF THE INVENTION

The present disclosure relates generally to the operation of a digital broadcast system and more specifically to the encoding and decoding of data for broadcast television that is intended for use by mobile, pedestrian and personal devices.

BACKGROUND OF THE INVENTION

This section is intended to introduce the reader to various aspects of art, which may be related to various aspects of the present invention that are described below. This discussion is believed to be helpful in providing the reader with background information to facilitate a better understanding of the various aspects of the present invention. Accordingly, it should be understood that these statements are to be read in this light, and not as admissions of prior art.

Television broadcast systems throughout the world have migrated from the delivery of analog audio and video signals to modern digital communications systems. For example, in the United States, the Advanced Television Standards Committee (ATSC) has developed a standard called "ATSC Standard: Digital Television Standard A/53" (the A53 standard). The A53 standard defines how data for digital television broadcasts should be encoded and decoded. In addition, the U.S. Federal Communications Commission (FCC) has allocated portions of the electromagnetic spectrum for television broadcasts. The FCC assigns a contiguous 6 MHz channel within the allocated portion to a broadcaster for transmission of terrestrial (i.e., not cable or satellite) digital television broadcasts. Each 6 MHz channel has a channel capacity of approximately 19 Mb/second based on the encoding and modulation format in the A53 standard. Furthermore, the FCC has mandated that transmissions of terrestrial digital television data through the 6 MHz channel must comply with the A53 standard.

The A53 standard defines how source data (e.g., digital audio and video data) should be processed and modulated into a signal that is transmitted through the channel. The processing adds redundant information to the source data so that a receiver that receives the signal from the channel may recover the source data even if the channel adds noise and multi-path interference to the transmitted signal. The redundant information added to the source data reduces the effective data rate at which the source data is transmitted but increases the potential for successful recovery of the source data from the transmitted signal.

FIG. 1 shows a block diagram of a typical transmitting system 100 that transmits signal compliant with the A53 standard. Data is generated by a transmission source 102 and is arranged into packets. The packets are 187 bytes in size and may contain one or more codewords. Each packet includes a 3-byte header of which 13-bits are a packet ID (PID) that identifies the type of data that are sent in the packet. For example, a packet with a PID that has a value of 0x11 (hex 11) may identify the content as having a first video stream and a packet comprising a PID that has a value of 0x14 may identify the contents of such packet as a first audio stream. A data randomizer 104 randomizes the packet and provides the packet to Reed-Solomon encoder 106. The Reed-Solomon encoder 106 calculates and concatenates 20 parity bytes to the randomized data to produce a R-S packet that has 207 bytes.

A convolutional interleaver 108 interleaves the R-S packet in order to further randomize the data in time. A trellis encoder 110 encodes the interleaved packet to produce a block of 828 3-bit symbols. The A53 standard specifies the use of 12 trellis encoders, wherein each trellis encoder is a 2/3-rate trellis encoder producing a 3 bit symbol for every two bits present in the interleaved packet. As a result, the trellis encoder 110 includes a de-multiplexer, twelve parallel 2/3-rate trellis encoders, and a multiplexer. Data from the convolutional interleaver 108 is de-multiplexed and distributed to the twelve trellis encoders and the symbols generated by the twelve trellis encoders are multiplexed into stream of symbols.

A sync multiplexer 112 inserts 4 predefined segment sync symbols at the beginning of each 828-symbol block to create an 832-symbol segment. In addition, the sync multiplexer 112 inserts a field sync comprising 832 symbols for every 312 segments that are generated. In particular, the field sync symbols precede the 312 segments.

An 8-VSB modulator 114 uses the multiplexed symbols, including the data encoded by the trellis encoder 110, the segment sync symbols, and the field sync to modulate a carrier signal using 8-VSB (vestigial sideband) modulation. Specifically, the 8-VSB modulator 114 generates a signal, wherein the amplitude of the signal is at one of 8 discrete levels, where each discrete level corresponds to a particular 3-bit symbol. The signal is thereafter converted from digital to analog signal format and up-converted to radio frequency, using circuitry not shown. The radio frequency signal is transmitted using an antenna 116. Typically, the combination of the data randomizer 104, the Reed-Solomon encoder 106, the convolutional interleaver 108, and the trellis encoder 110 are referred to as an 8-VSB encoder 120. 8-VSB encoder 120 may also be referred to as an A53 encoder or ATSC encoder.

The data generated by the transmission source 102 includes video that is source encoded using the motion picture entertainment group (MPEG) 2 format that is also equivalent to International Standards Organization/International Electrotechnical Commission (ISO/IEC) 13818-2 format. The transmission source 102 also includes audio data that is source encoded using Dolby Arc Consistency algorithm #3 (AC-3). The A53 standard also allows the use of metadata for other program elements such as program guide data and such program elements may be source encoded using other methods. In addition, The A53 standard allows transmission of video at a variety of video quality levels and display formats ranging from standard definition interlaced television quality to progressive scan widescreen high definition quality. The FCC requires that broadcasters must use the A53 standard to encode data generated by the transmission source 102. If the transmission of a digital television program broadcast does not require the entire 19 Mb/second capacity of the allocated channel, the broadcaster may use any excess capacity to broadcast other services, possibly even to devices such as portable receivers and cellular telephones. However, the FCC requires that any data transmitted to such other devices using the excess capacity must be transmitted in accordance with the A53 standard. Revision of the A53 standard is possible and is contemplated by the ATSC, however the evolution must occur such that that existing, or so-called legacy, digital television receivers may continue to be used. Similarly, encoding and transmission of signals in accordance with the existing A53 standard may be referred to as legacy encoding and transmission.

FIG. 2 shows a block diagram of a receiver 200 that may be used to extract the source information from a received signal compliant with the existing or legacy A53 standard. An antenna 202 develops a received electrical signal from an electromagnetic signal transmitted through the airwaves. An analog-to-digital (A/D) converter 204 produces digital samples of the received signal and a trellis decoder 206 decodes the digital samples to produce a stream of trellis-decoded estimates of bits in the data stream. A/D converter 204 may also include additional front end processing circuits such as a tuner for receiving a desired channel within the received signal. In accordance with the existing or legacy A53 standard, the trellis decoder 206 includes a signal de-multiplexer, twelve 2/3-rate trellis decoders and a signal multiplexer. The de-multiplexer distributes the digital samples among the twelve 2/3-rate trellis decoders and the multiplexer multiplexes the estimates generated byte each of the twelve 2/3-rate trellis decoders.

A convolutional de-interleaves 208 de-interleaves the stream of trellis-decoded bit estimates, producing sequences or packets arranged to include 207 bytes. The packet arrangement is performed in conjunction with the determination and identification of the location of the synchronization signals, not shown. A Reed-Solomon error correction circuit 210 considers each sequence of 207 bytes produced by the de-interleaver 208 as one or more codewords and determines if any bytes in the codewords or packets were corrupted due to an error during transmission. The determination is often performed by calculating and evaluating a set of syndromes or error patterns for the codewords. If corruption is detected, the Reed-Solomon error correction circuit 210 attempts to recover the corrupted bytes using the information encoded in the parity bytes. The resulting error-corrected data stream is then de-randomized by a de-randomizer 212 and thereafter provided to a data decoder 214 that decodes the data stream in accordance with the type of content being transmitted. Typically, the combination of the trellis decoder 206, the de-interleaver 208, the Reed-Solomon decoder 210, and the de-randomizer 212 are identified as an 8-VSB decoder 220 within receiver 200. It is important to note that, in general, the typical receiver for receiving signals compliant with the legacy A53 standard performs the receiving process in the reverse order of the transmitting process.

In general, the algorithms employed in Reed-Solomon encoding and decoding are well known to those skilled in the art. As described above, the Reed-Solomon encoder 106 of FIG. 1 generates a codeword that has 207 bytes by adding 20 parity bytes to a data packet having 187 bytes. The Reed-Solomon decoder 210 of FIG. 2 uses the 20 bytes added by the encoder to correct errors in up to 10 bytes of the codeword.

The Reed-Solomon error correction algorithm takes advantage of the properties of a Galois Field. Specifically, a Galois Field $GF(p^n)$ is a mathematical set comprising a finite number of elements $p^n$ where the values of p and n are integers. A particular Galois Field is defined using a generator polynomial $g(x)$. Each element of the Galois Field may be represented by a unique bit pattern having n bits. Furthermore, a unique polynomial of degree $p^n$ may be associated with each element where each coefficient of the polynomial is between 0 and p−1. Further, mathematical operations in the Galois Field have important properties. Addition of two elements of the Galois Field $GF(p^n)$ is defined as an element associated with a polynomial that has coefficients that are the modulo-p sum of the coefficients of the polynomials associated with the two elements being added. Similarly, multiplication of two elements is defined as the multiplication of the polynomials associated with the two elements modulo the generator polynomial $g(x)$ associated with the Galois Field. Addition and multiplication operators are defined over the Galois Field such that the sum and product of any two elements of the Galois Field are elements of the Galois Field. A property of the Reed-Solomon codeword is that multiplying each byte of the codeword by an element of the Galois Field results in another valid Reed-Solomon codeword. Furthermore, byte-by-byte addition of two Reed-Solomon codewords produces another Reed-Solomon codeword. The legacy A53 standard defines a 256 element Galois Field $GF(2^8)$ and the associated generator polynomial $g(x)$ for use in the Reed-Solomon algorithm. The properties of the Galois Field also create the ability to generate syndromes for the codewords in order to determine errors.

The output packets from the de-randomizer are provided to the data decoder 214. The data decoder 214 uses the PID in the header of the decoded packet to determine the type of information carried in the packet and how to decode such information. The PID in the header is compared to information in a Program Map Table (PMT) that may be periodically transmitted as part of the data stream and updated in the receiver. The data decoder 214 ignores any packet that has a PID for data packets that are not of a recognized type. In this manner, the legacy A53 standard allows for the creation of a new packet type not contemplated in the original standard by allowing a transmission source to assign a unique PID value for the new packet type. Legacy decoders that do not support the new packet type may ignore such packets while new decoders that do recognize the new packet type can process such packets.

As should be apparent, only those packets that are properly decoded by the 2/3-rate trellis decoder 206 and the Reed-Solomon decoder 210 in the receiver 200 are going to be provided to the data decoder 214. If the trellis decoder 206 or the Reed-Solomon decoder 210 cannot decode a packet, the receiver generally discards such packet as an error packet. If too many error packets are received, some receivers capable of receiving signals compliant with The A53 Standard may attempt to resynchronize with the transmitter.

It is important to note that signals compliant with the A53 standard, in general, may be transmitted in a manner other than over the air, including transmission over co-axial cable or telephone lines.

The existing or legacy A53 standard, at present, defines generating and transmitting a signal for the intended use by receivers that are generally fixed (e.g., in a home) and that are coupled to large antennas for capturing the transmitted signal. However, the transmitted signals are not sufficiently rugged or robust to allow a mobile receiver or a receiver with a small antenna that are used in portable televisions, vehicular televisions, cellular telephones, personal data assistants, etc. to effectively extract the source data encoded in such signals. In particular, the redundancy provided by the 2/3-rate trellis encoder is not sufficient and lower rate encoders (i.e., those that have greater redundancy) are necessary for mobile applications. Therefore it is desirable to introduce more robust encoding processes adapted to better perform with advanced receivers in mobile, handheld and pedestrian devices.

SUMMARY OF THE INVENTION

In accordance with an aspect of the present embodiments, a method is described including the steps of receiving a packet of data having a data payload and a header, byte code encoding the data in the packet, and altering information in the header in response to the byte code encoding.

In accordance with another aspect of the present embodiments, an apparatus is described including an encoder receiving a packet of data having a data payload and a header, the encoder encoding the data in the packet of data using a byte code encoding process and a header modifier coupled to the encoder block, the header modifier block receiving the encoded packet of data and altering information in the header in response to the byte code encoding.

In accordance with another aspect of the present embodiments, an apparatus is described including a packet identifier receiving a plurality of data packets, each data packet having a data payload and a header, the packet identifier identifying a data packet from the plurality of packets based on information in the header, a byte code decoder coupled to the packet identifier, the byte code decoder receiving the plurality of data packets and decoding the identified data packet using a byte code decoding process, and a Reed-Solomon decoder coupled to the byte code decoder, the Reed-Solomon decoder decoding at least the decoded identified data packet using a Reed-Solomon decoding process.

In accordance with another aspect of the present embodiments, a method is described including the steps of receiving a plurality of data packets, each data packet having a data payload and a header, identifying a data packet from the plurality of packets based on information in the header, decoding the identified data packet using a byte code decoding process, and decoding at least the decoded identified data packet using a Reed-Solomon decoding process.

BRIEF DESCRIPTION OF THE DRAWINGS

In the drawings:

FIG. 6 is a block diagram of an embodiment of a concatenated byte-code encoder of the present disclosure;

FIG. 7 is a table illustrating a map of data interleaving of the present disclosure;

FIG. 8 is block diagram of another embodiment of a concatenated byte-code encoder of the present disclosure;

FIG. 9 is a block diagram of a further embodiment of a concatenated byte-code encoder of the present disclosure;

FIG. 14 is a table illustrating row oriented data of the present disclosure;

FIG. 15 is a table illustrating column oriented data of the present disclosure;

The characteristics and advantages of the present invention may become more apparent from the following description, given by way of example.

DETAILED DESCRIPTION

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort would nevertheless be a routine undertaking of design, fabrication, and manufacture for those of ordinary skill having the benefit of this disclosure.

The following describes a system relating to television broadcast signals, and more particularly to broadcast signals as defined for use in the United States. The embodiments described may be used in mobile, handheld, or pedestrian devices. Examples of the devices used include, but are not limited to, cellular phones, intelligent phones, personal digital assistants, laptop computers, and portable televisions. Other systems utilized to transmit and receive other types of signals may include similar structures and processes. Those of ordinary skill in the art will appreciate that the embodiments of the circuits and processes described herein are merely one set of potential embodiments. As such, in alternate embodiments, the components of the system may be rearranged or omitted, or additional components may be added. For example, with minor modifications, the system described may be configured for use in satellite video and audio services or phone data services including services used elsewhere in the world.

Figure 3:
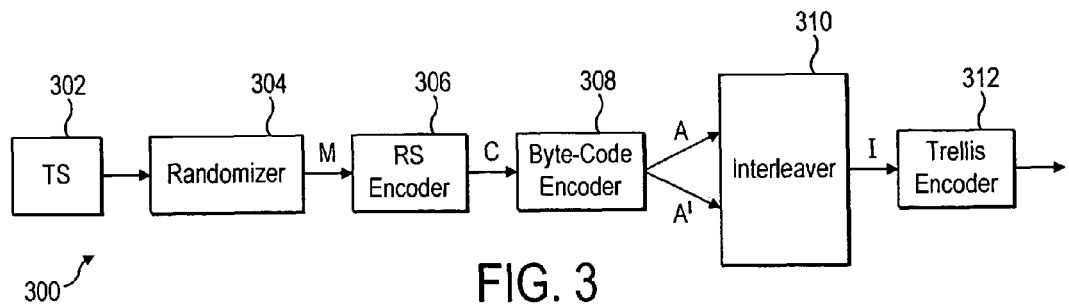
FIG. 3 is a block diagram of an embodiment of an encoder of the present disclosure.

Turning now to FIG. 3, a block diagram of an embodiment of an encoder 300 is shown. Encoder 300 includes processing circuitry adapted to encode data resulting in a rugged or robust data stream. Encoding the data in a rugged data stream allows recovery of the data in difficult transmission environments. For instance, the rugged data stream produced by encoder 300 permits improved reception of broadcast television signals by handheld, mobile, or pedestrian receiving devices. A transmission source 302 connects to randomizer 304. The randomizer 304 provides a signal M and connects to Reed Solomon encoder 306. The Reed Solomon encoder 306 provides a signal C and connects to a byte code encoder 308. The byte code encoder 308 provides two signals A and A' and connects each to interleaver 310. The interleaver 310 provides an output signal I and connects to trellis encoder 312. Certain blocks are similar to blocks previously described and as such will not be described in detail here.

The data randomizer 304 in FIG. 3 randomizes the stream of data packets from the transmission source 302. The stream of data packets are organized into groups of 187 bytes. It is important to note that other arrangements for the stream of data packets are possible. Additionally, each data packet may include one or more codewords. Reed-Solomon encoder 306 encodes each 187-byte randomized packet to produce a 207-byte packet containing one or more codewords. The Reed-Solomon encoder 306 typically produces the 20 new bytes and appends the 20 new bytes to the end of the 187-byte codeword. The byte-code encoder 308 further receives signal C and encodes each 207-byte Reed-Solomon packet to produce additional 207-byte codewords. In one embodiment, the byte code encoder 308 is a rate 1/2 encoder. The rate 1/2 encoder provides two output codewords for each codeword provided at the input. Each of the two codewords may be provided separately as signals A and A' as shown in FIG. 3. Other code rate encoders may be used for the byte code encoder 308 as will be described in further detail below. The convolutional interleaver 310 interleaves each of the 207-byte codewords and provides the result in a signal I to trellis encoder 312 in preparation for modulation and transmission. The Reed-Solomon encoder 306, the convolutional interleaver 310, and the trellis encoder 312 may be identical to those used in legacy transmitters that comply with existing television broadcast standards, such as the legacy A53 standard.

As described above, the two codewords or packets generated by a rate 1/2 byte-code encoder 308 include a duplicate of the originally input Reed-Solomon packet and a new codeword that provides redundancy to the Reed-Solomon packet. The two codewords may also be described as systematic data and non-systematic data. It is important to note that the codewords representing systematic and non-systematic data may be arranged to form larger data structures. In a preferred embodiment, the codewords may be organized to form a rugged data stream of data packets. The rugged data stream includes systematic packets, which are duplicates of the data packets in a stream A, and non-systematic packets generated by the processing of a byte code encoder in a stream A'. Non-systematic packets also include packets that may be derived from other systematic and non-systematic packets of the rugged data stream. Further, the packets in the rugged data stream may be further composed of systematic bytes and non-systematic bytes. In such embodiments, a systematic byte is a duplicate of byte of content data and a non-systematic byte is one that is derived from other systematic and non-systematic bytes.

The redundant or non-systematic codeword or packet output by a byte code encoder is the result of multiplying each element of the Reed-Solomon packet by an element b of the Galois Field. In one embodiment, if the transmission source 302 and data randomizer 304 generate a message M, which is comprised of bytes M(1), M(2), ..., M(187), where M(1) is the first byte of the message, M(2) is the second byte of the message, etc., then the Reed-Solomon encoder 306 thereafter produces a packet or codeword C from the message M, wherein the codeword C comprises bytes C(1), C(2), ..., C(207). Subsequently, the byte-code encoder 308 produces the codewords A and A' from the codeword C, as follows:

$$A(i)=C(i) \quad i=1, 2, \ldots, 207 \tag{1}$$

$$A'(i)=b*C(i) \quad i=1, 2, \ldots, 207 \tag{2}$$

The value b is a predetermined (non-zero) element of the same Galois Field $GF(2^8)$ that may used by the Reed-Solomon encoder 306. In an illustrative embodiment, the value of the b element is 2. It should be apparent that the codeword A' is also a Reed-Solomon codeword. That is, a Reed-Solomon decoder in a receiver that complies with the legacy A53 standard calculates valid syndromes from the codeword A' to determine if errors were introduced to the codeword A' during signal transmission and also to corrects any such errors using the calculated syndromes.

Figure 4:
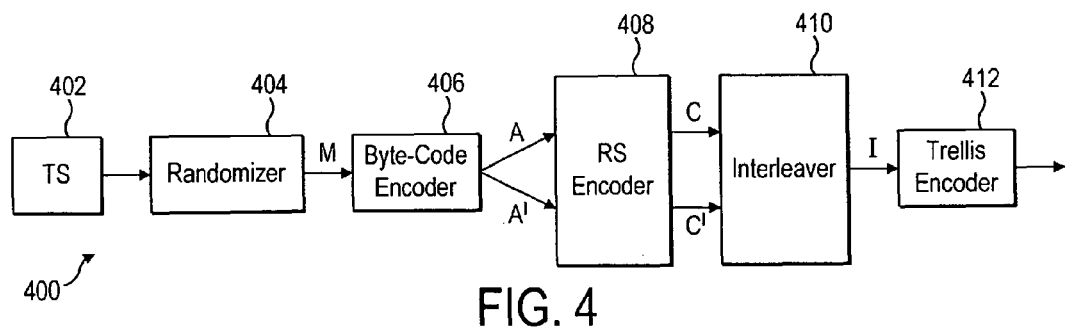
FIG. 4 is a block diagram of another embodiment of an encoder of the present disclosure.

Turning now to FIG. 4, a block diagram of another embodiment of an encoder 400 is shown. The blocks in encoder 400 have primarily the same functionality as described previously for encoder 300. However, several of the blocks have been rearranged in order of operation. The byte code encoder 406 has been positioned in front of the Reed-Solomon encoder 408. In this arrangement, the transmission source 402 and data randomizer 404 produce a message stream M. The message stream may be arranged into, for instance, 187-byte packets. A byte-code encoder 406, shown as a 1/2 rate encoder, generates two 187-byte packets for each incoming 187-byte message packet. As before, the two 187-byte packets include a duplicate of the message packet, labeled A and identified as a systematic packet, along with a new packet A', identified as a non-systematic packet that contains redundant data. It is important to note that packets labeled A and A' in FIG. 4 are different than the packets A and A' in FIG. 3.

The Reed-Solomon encoder 408 sequentially encodes the two packets A and A' to produce the two 207-byte codewords C and C', respectively. A convolutional interleaver 410 interleaves each codeword C and C' and a trellis encoder 412 thereafter encodes the interleaved data in preparation for modulation. The properties of Galois Field arithmetic used by the byte-code encoder 406 and the Reed-Solomon encoder 408 ensure that the codewords C and C' are identical to the codewords A and A', respectively. It is important to note that the re-ordering of the blocks is possible because of block processing and the underlying mathematical relationships are linear operations on the same Galois Field.

Figure 5:
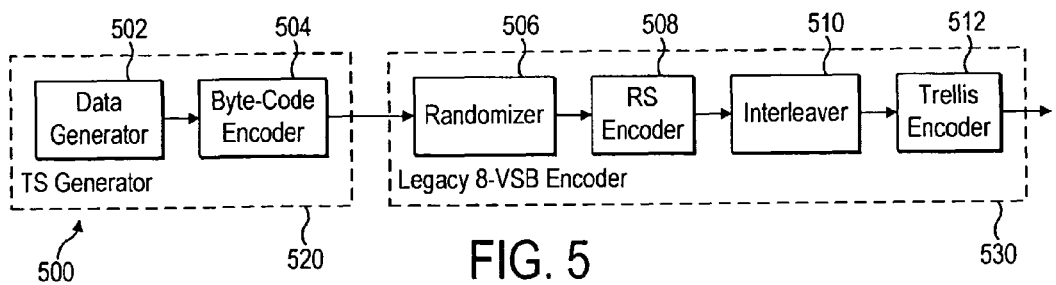
FIG. 5 is a block diagram of a further embodiment of an encoder of the present disclosure.

Turning now to FIG. 5, a block diagram of a further embodiment of an encoder 500 is shown. As before, the blocks in encoder 500 have primarily the same functionality as described previously for encoders 300 and 400. However, several of the blocks have been rearranged in order of operation. The byte code encoder 504 has been positioned in front of the randomizer 506. The data generator 502 generates a message stream arranged in, for instance, 187-byte data packets. For each such data packet the byte-code encoder 504 generates a systematic packet (i.e., a duplicate of the data packet) and generates additional non-systematic packets (i.e., byte-encoded packets by byte-code encoding the data packet). The packets (original data and encoded) generated by the byte-code encoder 504 are included in a rugged data stream that may be provided to a legacy 8-VSB signal encoder 530. Legacy 8-VSB signal encoder 530 is similar in function to the 8-VSB encoder 120 shown in FIG. 1. The legacy 8-VSB encoder 530 includes a data-randomizer 506, a Reed-Solomon encoder 508, a convolutional interleaver 510, and a trellis encoder 512. The legacy 8-VSB encoder 530 identically encodes the systematic packets and non-systematic packets compliant with The A53 Standard as described earlier. As shown, data generator 502 and a byte-code encoder 504 may be considered as part of a transmission source 520. Moreover, the additional functionality of byte-code encoder 504 to produce a rugged or robust data stream may be added with minimal change to the existing hardware structure of existing transmission equipment such as legacy 8-VSB encoder 530. It is important to note that the re-positioning of the randomizer 506 and byte-code encoder 504 is possible because of block processing and the underlying mathematical relationships are linear operations on the same Galois Field. Randomizer 506, like the Reed-Solomon encoder, uses the linear operation of multiplying each byte in the data by a constant value.

Byte-code encoder 504 encodes all of the bytes of the data packet, including the bytes that form the header containing the PID, to generate one or more non-systematic packets of the rugged data stream. Thus, the PID of each non-systematic packet is byte-code encoded and may no longer represent a PID value that is recognizable to a receiving device.

Figure 2:
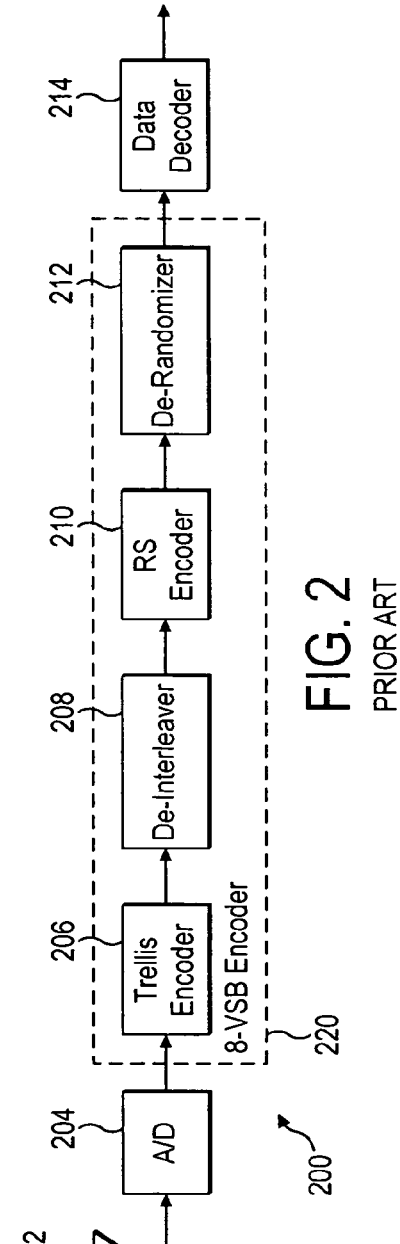
FIG. 2 is a block diagram of a typical receiver for receiving a signal compliant with the A53 Standard.

It should be apparent that any packets encoded by the embodiment of the transmitter depicted by encoder 500 may be decoded by an embodiment of a decoder similar to the decoder 220 described in FIG. 2 (e.g., a legacy receiver that complies with the A53 standard). The decoder 216 provides packets of the rugged data stream to the data decoder 214. The rugged data stream includes non-systematic packets that are encoded using a byte-code encoder that will not be decoded correctly by decoder 220. However, because such packets have a PID that is not associated in the Program Map Table (PMT) with an existing or legacy data format, the data decoder 214 in a legacy receiver ignores these non-systematic packets of the rugged data stream.

Byte-code encoder 504 uses equation (2) above to generate a non-systematic packet for each systematic packet and provides both packets to the legacy 8-VSB encoder 530 for transmission produces an encoded stream with an effective data rate of 1/2 (that is, 1 byte in, 2 bytes out). As mentioned earlier, byte code encoder 504 may be capable using other encoding rates to produce other effective data rates. In some embodiments, the byte-code encoder may produce one byte-encoded packet for every two source packets produced by the data generator 504 to generate a rate 2/3 rugged data stream comprising the two systematic packets and one non-systematic packet calculated as follows:

$$M_{AB}(i)=M_A(i)*b_1+M_B(i)*b_2 \; i=1,2,\ldots,187 \quad (3)$$

where $M_A$ and $M_B$ are consecutive systematic packets produced by the data generator 502 and $b_1$ and $b_2$ are predetermined elements of a Galois Field, such as the Galois Field used by the Reed-Solomon encoder 508. In an illustrative embodiment, the value of the $b_1$ and $b_2$ elements is 2. In some embodiments, the values of $b_1$ and $b_2$ may not be identical. The byte-code encoder 504 provides the packets $M_A$, $M_B$, and $M_{AB}$ to the legacy 8-VSB encoder 530 for further encoding and transmission.

Byte-code encoder 504 may use different coding rates to produce rugged data streams (i.e., ones having lower data rates) by including additional input data packets for generating the redundant packets. One embodiment of the byte-code encoder 504 produces a rate 4/9 data stream by employing four systematic packets $M_A$, $M_B$, $M_C$, and $M_D$ from the data generator 502 and 5 non-systematic packets calculated as follows:

$$M_{AB}(i)=M_A(i)*b_1+M_B(i)*b_2 \; i=1,2,\ldots,187 \quad (4)$$

$$M_{CD}(i)=M_C(i)*b_3+M_D(i)*b_4 \; i=1,2,\ldots,187 \quad (5)$$

$$M_{AC}(i)=M_A(i)*b_5+M_C(i)b_6 \; i=1,2,\ldots,187 \quad (6)$$

$$M_{BD}(i)=M_B(i)*b_7+M_D(i)*b_8 \; i=1,2,\ldots,187 \quad (7)$$

$$M_{ABCD}(i)=M_{AB}(i)*b_9+M_{CD}(i)*b_{10} \; i=1,2,\ldots,187 \quad (8)$$

The values $b_1, b_2, \ldots, b_{10}$ are predetermined elements selected from the Galois Field. In an illustrative embodiment, the values for $b_1, b_2, \ldots, b_{10}$ are 2. In addition, as shown in equation (8), the packet $M_{ABCD}$ is a redundant packet generated from other redundant packets only, specifically packets $M_{AB}$ and $M_{CD}$. It should be apparent that the redundant packet $M_{ABCD}$ may be alternately generated using the elements of the redundant packets $M_{AC}$ and $M_{BC}$. In some embodiments of the transmission source generator 520, elimination of one or more non-systematic packets may be performed in an operation known as puncturing. For instance, a punctured rate 4/8 may be produced by, for instance, not generating one of the packets that would have employed only redundant packets (i.e., $M_{ABCD}$ in this case). Code puncturing may be used to change the number of transmitted packets in order to meet certain limitations on number of packets or codewords transmitted.

Further, byte-code encoder 504 may also produce a rugged data stream that has a data rate of 8/27 by employing 8 data packets $M_A$, $M_B$, $M_H$ to produce 19 non-systematic packets, as follows:

$$M_{AB}(i)=M_A(i)*b_1+M_B(i)*b_2 \; i=1,2,\ldots,187 \quad (9)$$

$$M_{CD}(i)=M_C(i)*b_3+M_D(i)*b_4 \; i=1,2,\ldots,187 \quad (10)$$

$$M_{AC}(i)=M_A(i)*b_5+M_C(i)*b_6 \; i=1,2,\ldots,187 \quad (11)$$

$$M_{BD}(i)=M_B(i)*b_7+M_D(i)*b_8 \; i=1,2,\ldots,187 \quad (12)$$

$$M_{ABCD}(i)=M_{AB}(i)*b_9+M_{CD}(i)*b_{10} \; i=1,2,\ldots,187 \quad (13)$$

$$M_{EF}(i)=M_E(i)*b_{11}+M_F(i)*b_{12} \; i=1,2,\ldots,187 \quad (14)$$

$$M_{GH}(i)=M_G(i)*b_{13}+M_H(i)*b_{14} \; i=1,2,\ldots,187 \quad (15)$$

$$M_{EG}(i)=M_E(i)*b_{15}+M_G(i)*b_{16} \; i=1,2,\ldots,187 \quad (16)$$

$$M_{FH}(i)=M_F(i)*b_{17} \, M_H(i)*b_{18} \; i=1,2,\ldots,187 \quad (17)$$

$$M_{EFGH}(i)=M_{EF}(i)*b_{19}+M_{GH}(i)*b_{20} \; i=1,2,\ldots,187 \quad (18)$$

$$M_{AE}(i)=M_A(i)*b_{21}+M_E(i)*b_{22} \; i=1,2,\ldots,187 \quad (19)$$

$$M_{BF}(i)=M_B(i)*b_{23} \, M_F(i)*b_{24} \; i=1,2,\ldots,187 \quad (20)$$

$$M_{CG}(i)=M_C(i)*b_{25}+M_G(i)*b_{26} \; i=1,2,\ldots,187 \quad (21)$$

$$M_{DH}(i)=M_D(i)*b_{27}+M_H(i)*b_{28} \; i=1,2,\ldots,187 \quad (22)$$

$$M_{AC_{EG}}(i)=M_{AC}(i)*b_{29}+M_{EG}(i)*b_{30} \; i=1,2,\ldots,187 \quad (23)$$

$$M_{BDFH}(i)=M_{BD}(i)*b_{31}+M_{FH}(i)*b_{32} \; i=1,2,\ldots,187 \quad (24)$$

$$M_{ABEF}(i)=M_{AB}(i)*b_{33}+M_{EF}(i)*b_{34} \; i=1,2,\ldots,187 \quad (25)$$

$$M_{CDGH}(i)=M_{CD}(i)*b_{35} \, M_{GH}(i)*b_{36} \; i=1,2,\ldots,187 \quad (26)$$

$$M_{ABCDEFGH}(i)=M_{ABCD}(i)*b_{37} \, M_{EFGH}(i)*b_{38} \\ i=1,2,\ldots,187 \quad (27)$$

Further, a punctured code with data rate of 8/26 may be generated by the byte-code encoder 504 by not generating the packet $M_{ABCDEFGH}$, or another packet generated from only redundant packets.

As described above, a byte code encoder may be configured to produce certain encoding code rates based on the number of codewords or packets used and the number of codewords or packets formed through a single encoding process. In addition, more complicated code rates may be constructed using particular arrangements of the previously described code rate encoders as building blocks or constituent code rate encoders. Further, additional processing blocks may be included to form a concatenated byte-code encoder. For example, a concatenated byte-code encoder may use additional interleaving blocks between constituent byte-code encoders in addition to redundancy to improve the ruggedness of the data stream produced. Various embodiments of concatenated byte-code encoders will be described below.

Turning now to FIG. 6, embodiment of a concatenated byte-code encoder 600 is shown. The concatenated byte-code encoder receives packets or codewords and provides them to a first 2/3 rate byte-encoder 602. The output of the first 2/3 rate byte-code encoder 602 is provided to an interleaver 604. The output of the interleaver 604 is provided to a second 2/3 rate byte-code encoder 606. The output of the second 2/3 rate byte-code encoder 606 is provided to a byte puncture block 608. The output of the puncture block 608 is provided to a data packetizer 610. The output of the data packetizer 610 may be provided for further processing (e.g. legacy transmission encoding as previously described in FIG. 5.)

The first 2/3-rate byte-code encoder 602 receives 12 bytes of the content data packets and generates a first byte-code encoded stream from the 12 bytes. For every two content data bytes $M_A$ and $M_B$ of the 12 bytes, the first byte-code encoded stream included duplicates of the bytes $M_A$ and $M_B$ and a redundant byte $M_{AB}$ that is calculated as described earlier. In some embodiments, the content data bytes $M_A$ and $M_B$ are bytes of one content data packet generated by a data generator (e.g. data generator 502 in FIG. 5.) In other embodiments, the first 2/3-rate byte-code encoder 602 selects the content data bytes $M_A$ and $M_B$ from two different content data packets A and B, respectively. For every 12 bytes of content data, 18 bytes are output as part of the first byte-code encoded output stream.

The first byte-code encoded stream is interleaved by an interleaver 604 to produce an interleaved stream containing 18 interleaved bytes. The interleaver 604, as well as other interleavers described below, may use any of the interleaving methods known in the art (e.g., pseudo-random, row-column, code-optimized, etc.). In addition, interleavers may also include a memory with a storage capacity to store the entire interleaver data length. In a preferred emobodiment, interleaver 604 arranges the output bytes as presented in table 700 shown in FIG. 7. Table 700 includes a row 710 indicating the position of the bytes at the input. Row 720 indicates the order of the bytes as they are read out at the output. The interleaved stream is provided to a second 2/3-rate byte-code encoder 606, The second 2/3 rate byte-code encoder 606 encodes the groups of 18 interleaved bytes in the interleaved stream to generate a second byte-code encoded stream that includes groups of 27 bytes. As described above, for every two bytes $I_A$ and $I_B$ produced by the interleaver, the second 2/3-rate byte-coded stream has duplicates of the two bytes $I_A$ and $I_B$ and a byte $I_{AB}$. It should be apparent that byte $I_A$ may be a duplicate of one of the bytes of content data generated by a data generator (e.g. data generator 502 in FIG. 5.) or may be a byte developed as a redundant or non-systematic byte by the first byte-code encoder 602. Similarly, the byte $I_B$ may be a duplicate of a byte of the content data or a byte developed as a redundant or non-systematic by first byte-code encoder 602.

Interleavers used in linear encoders are traditionally very long in interleaver length or depth. The interleavers, such as interleaver 604, used in the concatenated byte code encoders are short in length and optimized for the coding rate. Contrary to traditional approaches, byte code interleavers emphasize low latency. For instance, A byte puncture block 608 removes one byte from the group of 27 bytes in the second byte-code encoded stream to produce a punctured stream containing groups 26 bytes. Byte puncturing is used to improve data efficiency by reducing the number of bytes provided and transmitted for a given coding structure. However, the improved data efficiency is traded off against the resulting degradation in performance in the decoding circuitry in a receiver due to the absence of one or more encoded bytes from the data stream. Byte puncturing may also be used to produce a grouping or block of bytes or packets of encoded data that is convenient for the transmission format. Coding structures based on certain groupings of bytes or packets are often referred to as block codes.

Byte puncture block 608 may also remove more than 1 byte from the second encoded stream. For instance, it may be possible to identify 3 bytes that may be removed to produce a 12/24-rate data stream. Puncturing more than one byte will further degrade the effectiveness of the encoding while gaining an improvement in coding rate. Removal of additional bytes in the byte puncture block 608 is achieved based on optimal interleaving in interleaver 604. In this way the puncturing and interleaving interact to allow an optimal code rate based on producing a given output block size of output packets.

Packetizer 610 combines and groups bytes from the punctured stream into discrete packets of 187 bytes. The rugged data stream produced by the components of the byte-code encoder 600 produces a 12/26-rate data stream. The byte code encoder 600 may also produce a 12/27-rate data stream if the byte puncture block 608 is not used.

Concatenated byte-code encoders similar to concatenated byte-code encoder 600 may be employed to produce rugged data streams other than the 12/27-rate and 12/26-rate rugged data streams described above. Turning to FIG. 8, another block diagram of an embodiment of a concatenated byte-code encoder 800 is shown. The concatenated byte-code encoder 800 is similar to the byte-code encoder 600 except that a first 2/3-rate byte-code encoder 802 produces a first byte-code encoded data stream containing groups of 6 bytes for every 4 bytes of content data. Interleaver 804 interleaves the 6 bytes and the second 2/3 rate byte-code encoder 806 produces a second byte-code encoded data stream containing groups of 9 bytes for every 6 bytes provided. Interleaver 804 represents the smalles possible interleaver length for a concatenation of two 2/3 rate byte code decoders. Byte puncture 808 removes one byte for every 9 bytes generated by the second 2/3 rate byte-code encoder 806. The rugged data stream produced by byte-code encoder 800 is encoded as a 4/8-rate byte code. The byte-code encoder 800 may also be used to produce a 4/9-rate byte code if the byte puncture 808 is not used.

Turning now to FIG. 9, a block diagram of yet another embodiment of a concatenated byte-code encoder 900 is shown. The first byte-code encoder 902 and the interleaver 904 are identical to those of byte-code encoder 600. However, the second byte-code encoder 906 is a 1/2-rate byte-code encoder. The 1/2-rate byte-code encoder 906 encodes the groups of 18 interleaved bytes in the interleaved stream to generate a second byte-code encoded stream that includes groups of 27 bytes. As described above, for every one byte I produced by the interleaver 904, the 1/2-rate byte-code encoded stream includes a duplicate of byte I and a non-systematic byte I'. It should be apparent that byte I may be a duplicate of one of the bytes of content data generated by a data generator (e.g. data generator 502 in FIG. 5.) or may be a byte developed as a redundant or non-systematic byte by the first byte-code encoder 902.

A byte-puncture block 908 removes one byte from the group of 36 bytes in the second byte-code encoded stream to produce a punctured stream containing groups 35 bytes. The concatenated byte-code encoder 900 may produce a 12/35-rate punctured rugged data stream or a rate 12/36 non-punctured data stream.

Figure 10:
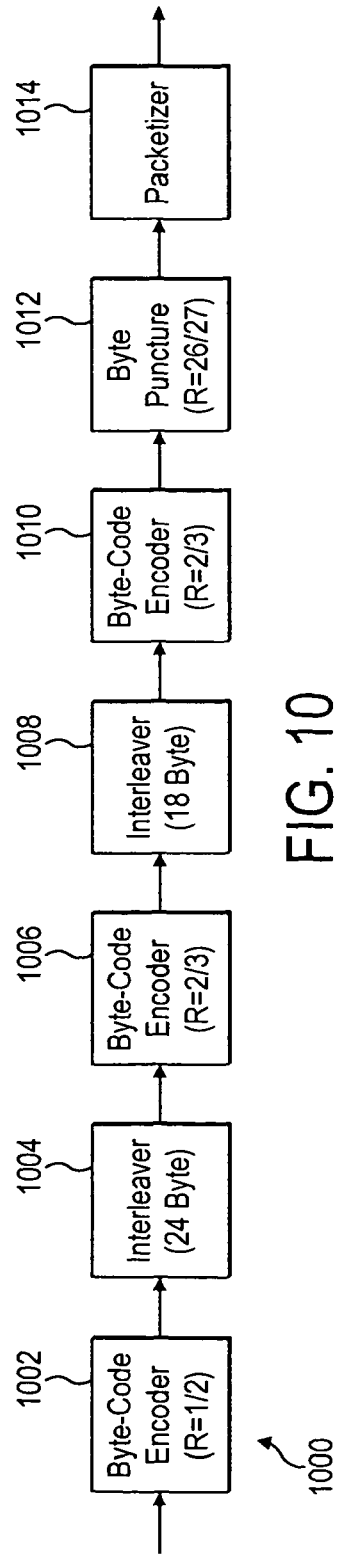
FIG. 10 is a block diagram of yet another embodiment of a concatenated byte-code encoder of the present disclosure.

Although FIGS. 6, 8 and 9 show embodiments of concatenated byte-coder encoders that utilize two constituent byte-code encoders and one interleaver, other embodiments of the byte-coders may include additional constituent byte-code encoders and interleavers to produce rugged data streams having other data rates. Turning now to FIG. 10, a block diagram of a further embodiment of a concatenated byte-code encoder 1000 is shown. Encoder 1000 includes three constituent byte-code encoders, two interleavers, and a puncture block. A 1/2-rate byte-code encoder 1002 receives content data bytes from a data generator (such as the data generator 502). The 1/2-rate byte-code encoder generates groups of 24-bytes in a first byte-code encoded stream for every 12 bytes of content data received.

Figure 11:
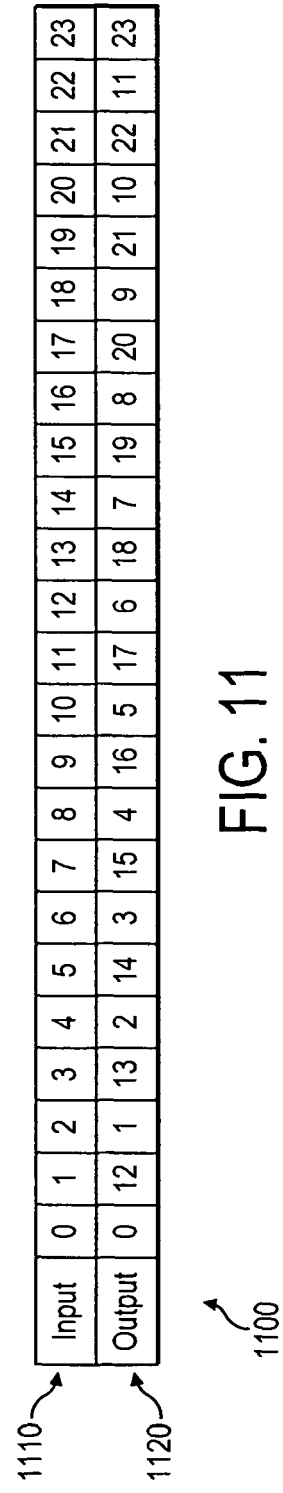
FIG. 11 is a table illustrating another map of data interleaving of the present disclosure.

A first interleaver 1004 interleaves the 24-byte groups in the first byte-code encoded stream and provides an interleaved group of 24 bytes in a first interleaved stream to a first 2/3-rate byte-code encoder 1006. In a preferred embodiment, first interleaver 1004 arranges the output bytes as presented in table 1100 shown in FIG. 11. Table 1100 includes a row 1110 indicating the position of the bytes at the input. Row 1120 indicates the order of the bytes as they are read out at the output. The first 2/3-rate byte-code encoder 1006 produces a second byte-code encoded stream containing groups of 36 bytes for each group of 24 bytes provided. A second interleaver 1008 interleaves the 36-byte second byte-code encoded stream by dividing each group of 36 bytes into two sets of 18 bytes. Second interleaver 1008 interleaves each set of 18 bytes and provides the interleaved data to a second 2/3-rate byte-code encoder 1010 as two 18-byte interleaved streams. The second 2/3-rate byte-code encoder 1010 operates in a manner similar to the first 2/3-rate byte-code encoder 1006 and encodes each 18-byte interleaved stream to produce a third byte-encoded stream containing groups of 27 bytes. A byte puncture block 1012 punctures 1 byte of the third byte-encoded stream and provides 26 bytes to a packetizer 1014. The packetizer 1014 regroups the sets of 26 bytes separated by interleaver 1008. Packetizer 1014 also combines and groups bytes from the punctured stream into discrete packets of 187 bytes as described previously. Concatenated byte-code encoder 1000 produces a 12/54 non-punctured rugged data stream or a 12/52 punctured data stream because the second 2/3-rate byte-code encoder 910 produces 2 27 byte byte-code encoded streams for every 12 bytes received at the input of encoder 1000.

Figure 12:
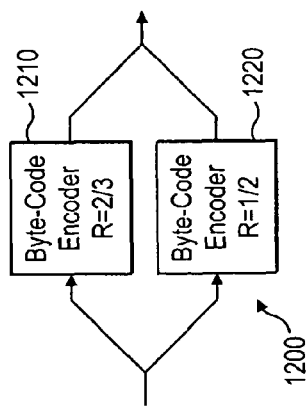
FIG. 12 is a block diagram of a still further embodiment of a concatenated byte-code encoder of the present disclosure.

Turning to FIG. 12, a block diagram showing a still further embodiment of a concatenated byte-code encoder 1200 is shown. Concatenated byte-code encoder 1200 includes two constituent byte-code encoders connected and operated in parallel. In other words, the concatenation is a parallel concatenation as opposed to a serial concatenation as described previously. 17 bytes from an input stream are separated into a first group of 16 bytes and a second group of 1 byte. A 2/3-rate byte-code encoder 1210 receives the first group of 16 bytes and generates a 24-byte first byte-code encoded stream for every 16 bytes of content data received. A 1/2-rate byte-code encoder 1220 receives the second group of 1 byte and generates a 2-byte second byte-code encoded stream for every 1 byte of content data received. The first byte code encoded stream containing groups of 24 bytes and the second byte-code encoded stream containing groups of 2 bytes are concatenated to form the final byte-code encoded stream containing groups of 26 bytes. Concatenated byte-code encoder 1200 produces a rate 17/26 non-punctured rugged data stream, It should be apparent to one skilled in the art that concatenated byte-code encoders with rates other than those shown in FIGS. 6, 8, 9, 10, and 12 may be used to produce rugged data streams at various code rates. Similarly, other types or arrangements of interleavers or puncture blocks may be substituted for those used in the described embodiments.

Figure 13:
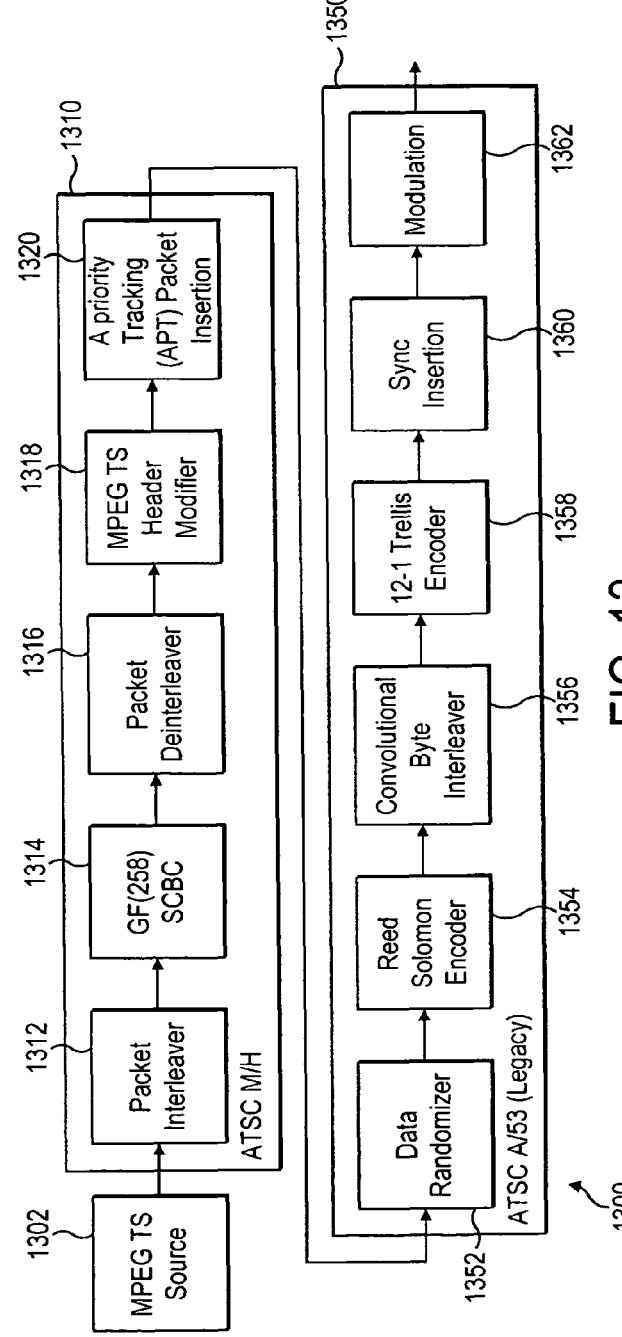
FIG. 13 is a block diagram of yet another embodiment of an encoder used in a transmitting device of the present disclosure.

Turning now to FIG. 13, a block diagram of a still further embodiment of an encoder 1300 is shown. Encoder 1300 is an alternative to encoder 500 shown in FIG. 5 and includes an MPEG transport stream source 1302. The MPEG transport stream source 1302 is connected to an ATSC M/H block 1310 that contains several additional blocks. The blocks contained within the ATSC M/H block 1310 process an incoming data stream and produce a rugged data stream adapted for reception and use by mobile, pedestrian, and handheld devices. These blocks will be further described below. The ATSC M/H block 1310 is connected to an ATSC A53 legacy block 1350 that also contains several additional blocks within it. The data randomizer 1352, Reed-Solomon encoder 1354, convolutional byte interleaver 1356, trellis encoder 1358, sync insertion block 1360, and modulation block 1362 contained within ATSC A53 legacy block 1350 are similar to those blocks described in FIG. 1. As a result, these blocks will not be further described here.

Within ATSC M/H block 1310, a packet interleaver 1312 receives a stream of data arranged in packets. Each packet contains 187 bytes and includes a 3 byte header used for packet identification. The output of the packet interleaver 1312 is provided to a GF(256) Serial Concatenated Block Coder (SCBC) 1314. The output of the GF(256) SCBC 1314 is connected to a packet deinterleaver 1316. The output of the packet deinterleaver 1316 is connected to a transport stream header modifier 1318. The output of the transport stream header modifier 1318 is connected to an a-priori transport packet inserter 1320. The output of the a-priori transport packet inserter 1320 is connected to the ATSC A53 legacy encoder 1350.

Figure 14:
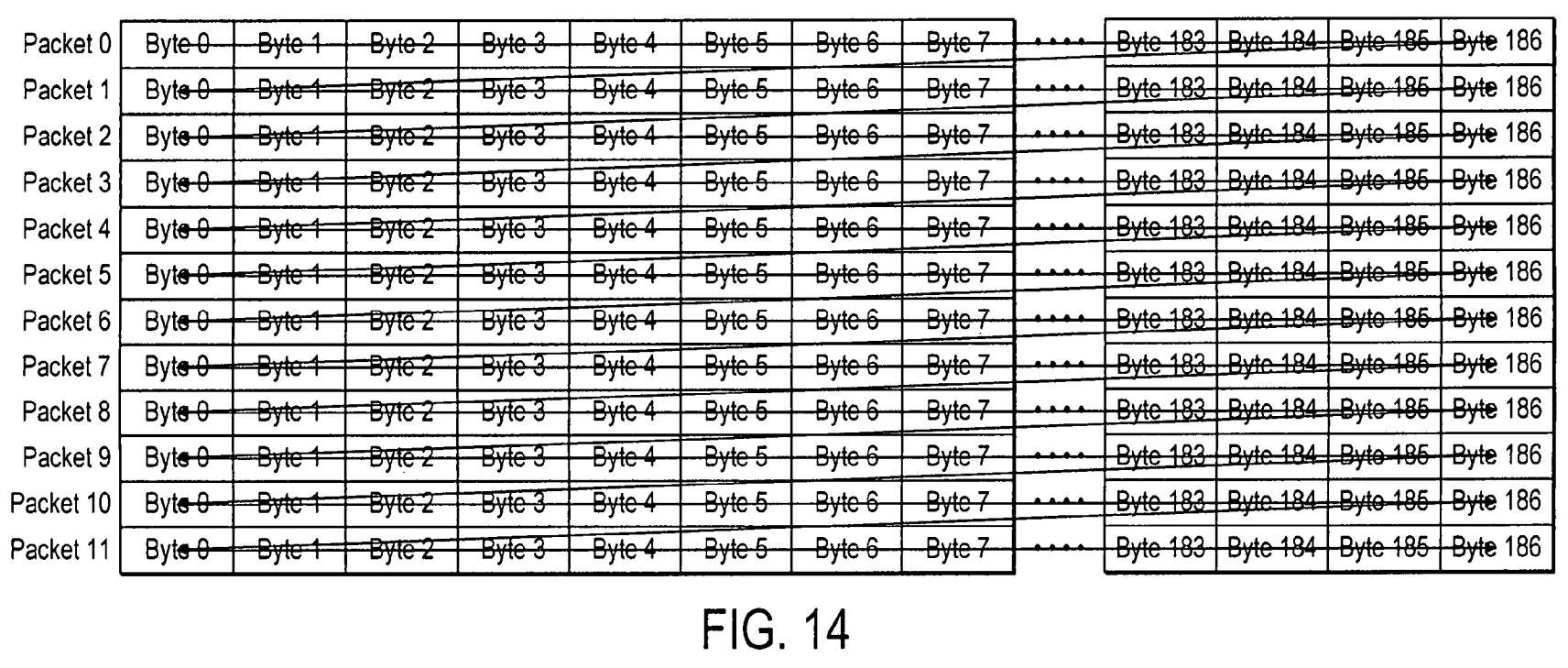
Figure 15:
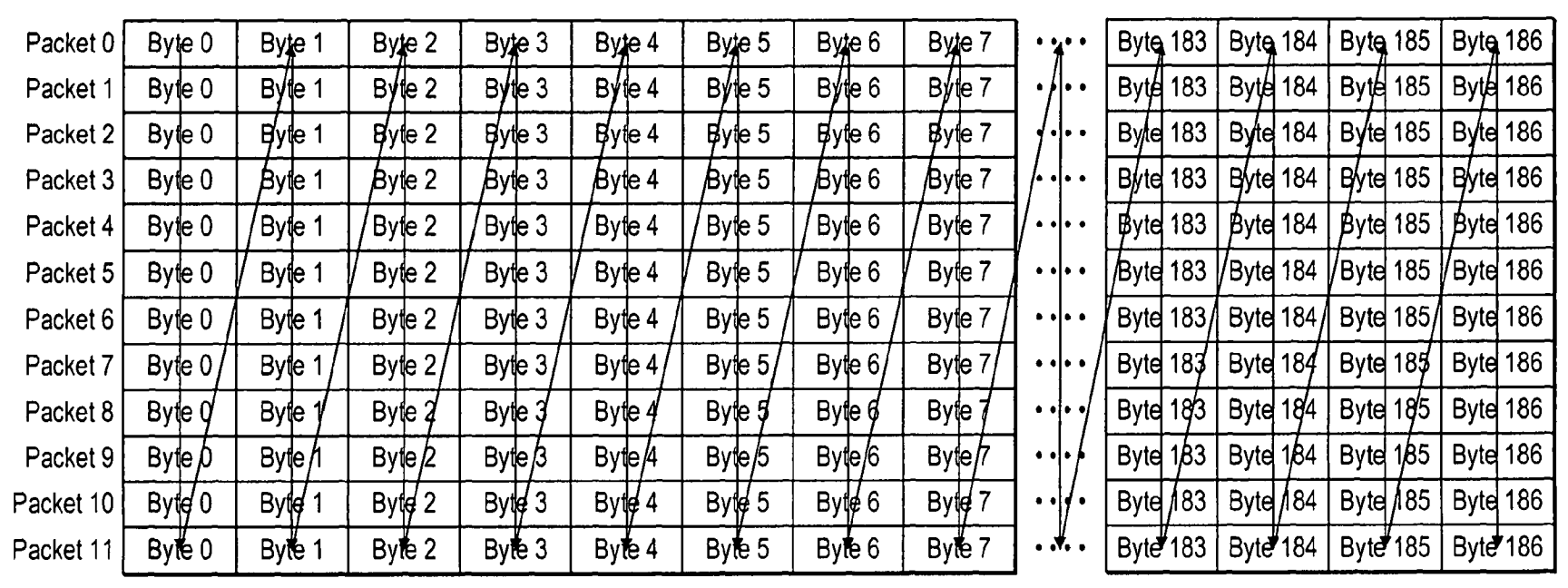

The packet interleaver 1312 rearranges the data received as packets arranged in rows into codewords based on columns of bytes from the rows of packets. Packet interleaver 1312 takes the bytes from a fixed number of consecutive packets in a row-by-row order as illustrated in FIG. 14, and outputs the bytes column by column as illustrated in FIG. 15. In particular, FIGS. 4 and 15 illustrate reading in 12 rows of 187-byte packets and outputting 187 columns of 12-byte codewords. As a result of the packet interleaving, all of the first bytes, labeled byte 0, are grouped together; all of the second bytes, labeled byte 1, are grouped together; and so forth. The number of packets read into the interleaver constitute a source frame and equals the number of source codewords or symbols required for processing in GF(256) SCBC 1314. It is important to note that the dimension of packet interleaver 1312 may changed based on the type and size of memory included. For instance, the first dimension may be changed to columns and the second dimension changed to rows. Additionally other dimensional arrangements may be used.

The GF(256) SCBC 1314 is a block code encoder similar to the byte code encoders described previously. In particular, the GF(256) SCBC 1314 is implemented using short linear block codes over the Galois Field (256) space. Two constituent block codes may be used. A rate 1/2 block code encoder uses the following generator matrix:

$$G=(1\ 2) \quad (28)$$

The matrix in (28) includes the b element with a value of from equation (1) present in the second column. A rate 2/3 block code encoder uses the following generator matrix:

$$G = \begin{pmatrix} 1 & 0 & 2 \\ 0 & 1 & 2 \end{pmatrix} \quad (29)$$

The generator matrix is formed using an identity matrix and a column of b elements. The third column in matrix (29) includes the b elements from equations (2) and (3) with values of 2. It is important to note that the coefficients in the generator matrix for each constituent code have been optimized based on the relationship of the block code encoding to the entire error correction system and modulation process. The optimization has especially taken into account the trellis coding and bit to symbol mapping in the 8-VSB modulation because these aspects are the first aspects in the receiving and demodulation process.

The GF(256) SCBC 1314 may be either a simple or concatenated block code encoder. A concatenated block code encoder may include other functions such as interleaving and puncturing as described earlier. The GF(256) SCBC 1314 may also be capable of encoding multiple encoding rates and may further be capable of switching rate modes through a rate mode controller, not shown. In a preferred embodiment, the GF(256) SCBC 1314 may be adapted to encode the incoming stream of data using one of a rate 1/2 constituent code as described earlier, a rate 12/26 code as shown in FIG. 6, a rate 12/52 code as shown in FIG. 10, or a rate 17/26 code as shown in FIG. 12.

The GF(256) SCBC 1314 encodes the bytes along the columns outputted from interleaver 1312. In other words, the GF(256) SCBC 1314 encodes following the second dimension of an interleaver matrix formed through the processing in packet interleaver 1312.

The packet deinterleaver 1316 receives the encoded stream of codewords produced by the GF(256) SCBC 1314 and outputs reconstituted rows of 187-byte packets. Packet deinterleaver 1316 inputs the encoded codewords in column by column order, with each column including the redundant or non-systematic bytes added by the processing in the GF(256) SCBC 1314, and outputs the bytes in a row by row arrangement. The process is essentially a reverse of the process described for packet interleaver 1312 with reversing the order of FIGS. 14 and 15. The packet de-interleaver 1312 inputs the same number of columns of codewords, with each codeword now including an encoded set of non-systematic bytes. The number of rows at the output corresponds to the encoded codeword length. For instance, in a 12/26 code rate, 26 rows of packets will be output. It is important to note that the dimension of packet de-interleaver 1316 may changed based on the type and size of memory included. Further, the first dimension may be changed to rows and the second dimension changed to columns. Additionally other dimensional arrangements may be used.

The packets may be arranged into two distinct groups. The first group of packets may be referred to as systematic packets and are the same as the original packets of data provided by the transport stream source 1302. The second group of packets may be referred to as non-systematic packets and are parity packets formed by the block coding process in the GF(256) SCBC 1314. It is important to note that, as a result of the block encoding process, the number of columns (i.e. the size of the second dimension) has been increased.

The MPEG transport stream header modifier 1318 receives the deinterleaved 187-byte packets containing groups of systematic and non-systematic packets. As described earlier, each packet contains a 3 byte header. The 3 bytes include a PID, along with several other bits or groups of bits used to convey information regarding the packet. In order to maintain the most efficient operation of receivers capable of receiving the legacy or A53 broadcast signal but not capable of correctly decoding the ATSC M/H encoded packets (e.g. legacy receivers), certain bits in the headers of a portion of the ATSC M/H packets may be modified. By modifying these bits in the non-systematic packet headers, the legacy receivers should ignore the packets while also not considering the packets as corrupt. For instance, the MPEG transport stream header modifier 1318 may set the TEI bit, the payload unit start indicator bit, and the transport priority bit to a bit value of '0'. In addition, the scrambling control and adaptation field bits (2 bits each) may be set to '00'. The continuity counter, 3 bits long, may also be set to '000'. Finally, the PID may be set to a unique and unused value, such as a known value that will ignored by all legacy receivers. It is important to note that since the MPEG transport stream header modifier 1318 will modify each header for the group of non-systematic packets, it may not be necessary for the GF(256) SCBC 1314 to process the headers for the group of non-systematic packets. Additionally, the MPEG transport stream header modifier 1318 may also modify the headers of the systematic packets if these packets are not to be processed and correctly decoded by a legacy receiver. If the systematic packets are not encoded by the GF(256) SCBC encoder 1314 or processed by MPEG transport stream header modifier 1318, the resultant stream of data may be simulcast to and received by both mobile devices and legacy receivers.

The a-priori tracking packet inserter 1320 may place predetermined tracking packets into the rugged data stream. The predetermined packets represent packets of information that are completely or mostly known to a receiver capable of receiving the rugged data stream, such as the receiver used in a mobile, pedestrian, or handheld device. The predetermined packets are used in the receiver to assist in decoding the trellis state created during the legacy or existing A53 encoding portion of the signal encoding and transmission. The predetermined packets may also assist with convergence in the equalizer portion of the receiver. It is important to note that the predetermined packets are not intended to improve reception in a legacy receiver, but may still result in a potential improvement. Also, unlike conventional training information, the predetermined packets are not directly identifiable at the transmitter output because the predetermined packets are added before additional legacy encoding is performed. In particular, the predetermined packets are altered by the processing of the trellis encoding. As a result, the predetermined packets do not provide direct training during trellis decoding but rather provide a priori branch information used in determining a trellis decoding map or branch.

The predetermined tracking packets may be generated in a number of ways using known training sequence processes. In a preferred embodiment, the predetermined tracking packet includes a valid header with the remaining bytes generated using a pseudo-random number (PN) generator that is also known to the receiver. The predetermined tracking packets, which may also be referred to as a-priori training data, trellis-obscured training data, or pseudo-training packets, may be distributed in some manner throughout the ATSC M/H transmission or may be clustered in a group including placing the packets or groups of packets in a manner that serves as a preamble for the ATSC M/H signal transmission.

The legacy ATSC encoder 1350 identically encodes the systematic packets and non-systematic packets in compliance with the legacy A53 standard as described earlier. The additional functionality of ATSC M/H block 1310 to produce a rugged or robust data stream may be added with minimal change to the existing hardware structure of transmission equipment. Additionally, portions of incoming packets from the MPEG transport source 1302 may be extracted for encoding at one or more of the encoding rates in the ATSC M/H block 1310. The encoded packets may then be reinserted in or appended to the remaining unprocessed portion of the input packets and the encoded and unprocessed portions both encoded in the ATSC legacy encoder 1350. Alternately, a separate stream of packets may be provided to the ATSC M/H block 1310 and the encoded output inserted in or appended to a second stream of packets and provided to the ATSC legacy encoder 1350.

Figure 16:
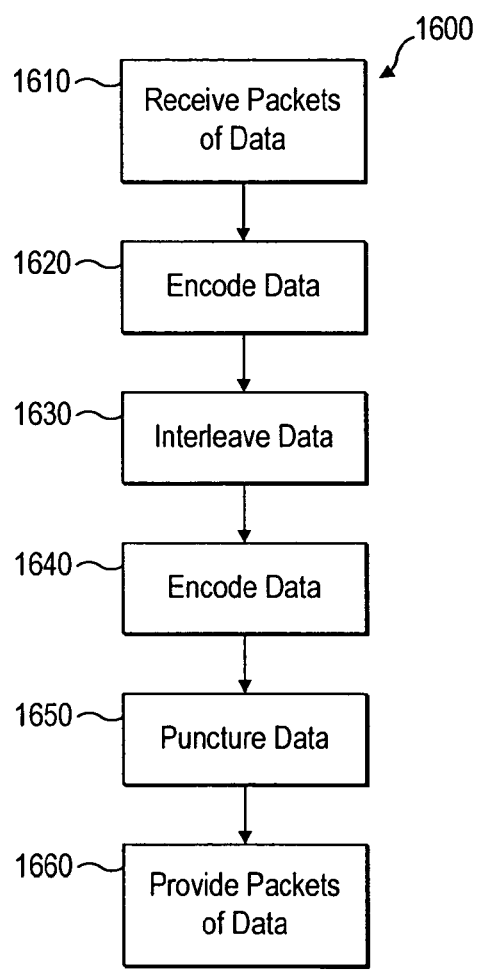
FIG. 16 is a flow chart of an embodiment of an encoding process of the present disclosure.

Turning now to FIG. 16, a flow chart showing an embodiment of an encoding process 1600 is shown. Process 1600 illustrates a concatenated byte-code encoding process that may be used to generate a rugged data stream from an input stream of data. Process 1600 will be primarily described with reference to concatenated byte-code encoder 600 shown in FIG. 6. However, the process could easily be adapted to any byte-code encoder, including the encoders shown in FIGS. 6, 8, 9, 10, and 12 and described above. It is also important to note that process 1600 may be performed using hardware involving discrete processing blocks or an integrated circuit containing some or all of the necessary blocks, using software operating in a microprocessor device, or a combination of both hardware and software. Additionally, process 1600 will be described with reference to bytes, codewords, and packets of data. However, it should be apparent to one skilled in the art that other data configurations or arrangements are possible and may be used.

First, at step 1610, a stream of data is received. The stream of data may be arranged such that bytes of data may be grouped as codewords and further arranged into packets containing all or portions of one or more codewords. For instance, the data may be arranged in packets containing 187 bytes of data, with each packet containing a packet header used for identification purposes. Next, at step 1620, the packets of data are byte-code encoded. The encoding at step 1620 may be performed using one of the constituent encoders discussed previously. For instance, the encoding step 1620 may use rate 2/3 byte-code encoding that results in outputting 18 bytes of data for every 12 input bytes of data. Alternately, the encoding step may use another byte-code encoding rate, such as rate 1/2. The encoding step 1620 may use a generator matrix as shown in equations (28) and (29) to supplement the input bytes of data. Supplementing the input data includes creating error creating error correction or redundant data bytes through an encoding process such as a byte code or block code encoding process. The output bytes include duplicates of the 12 input bytes of data, known as systematic bytes, along with 6 bytes of redundant or non-systematic data.

Next, at step 1630, the encoded data bytes from step 1620 are interleaved. Several interleaving arrangements may be used. For instance, an interleaving arrangement as illustrated in FIG. 7. The interleaving arrangement in FIG. 7 provides for a relatively small interleaver size while maximizing the distance of the codes generated in the byte-code encoding step 1620. In other words, the interleaver size may be optimized to reduce the byte error rate in the presence of white noise. Next, at step 1640, the interleaved bytes from step 1630 are byte-code encoded a second time. The second byte-code encoding step 1640 may be performed using one of the constituent encoders discussed previously. For instance, the encoding at step 1620 may use a rate 2/3 byte-code encoding which results in outputting 27 bytes of data for every 18 input bytes of data. Alternately, the encoding step may use another byte-code encoding rate, such as rate 1/2. The encoding step 1640, as above, may use a generator matrix as shown in equations (28) and (29) to supplement the input bytes of data. The output bytes include duplicates of the 18 input bytes of data, known as systematic bytes, along with 9 bytes of redundant or non-systematic data. It should also be apparent that some systematic bytes may be duplicates of one of the bytes of original input data or may be a byte developed as a redundant or non-systematic byte by the first byte-code encoding step 1620.

Next, at step 1650, the second encoded stream of bytes of data is punctured. The puncturing step 1650 removes one of the bytes of data from the second encoded stream. The removed byte may be a non-systematic byte of the second encoding step 1640, and may further be a non-systematic byte also from the first encoding step 1620. Last, at step 1660, the data stream is provided for additional processing, such as legacy or existing A53 encoding. Step 1660 may also include re-packetizing the encoded bytes into packets similar to the arrangement originally received prior to providing the data stream. The process 1600 described results in the generation of a rate 12/26 byte-code encoded data stream.

Puncturing at step 1650 may be removed from process 1600. The choice of the byte for removal is performed based on the interleaving in step 1630. For instance, it may be possible that the second encoding step 1640 may not generate one of the non-systematic bytes as part of its encoding, directly resulting in a punctured stream. Additionally, the puncturing step 1650 may be bypassed to produce an unpunctured rate 12/27 byte-code encoded data stream.

Puncturing at step 1650 may also remove more than 1 byte from the second encoded stream. For instance, it may be possible to identify 3 bytes that may be removed to produce a rate 12/24 byte-code encoded data stream. Puncturing more than one byte will further degrade the effectiveness of the encoding while gaining an improvement in coding rate. Removal of additional bytes in the puncturing step 1650 is achieved based on optimal interleaving at step 1630. In this way the puncturing and interleaving interact to allow an optimal code rate based on producing a given output block size of output packets.

It is important to note that steps 1630 and 1640 may be repeated in order to form a different concatenated byte code encoding process including two interleaving steps and three byte-code encoding steps. A process using repeated steps 1530 and 1540 may be used by encoders such as encoder 900 shown in FIG. 9 to generate a rate 12/52 rugged data stream. Process 1600 may also easily be adapted to other code rates such as those previously described above.

Figure 17:
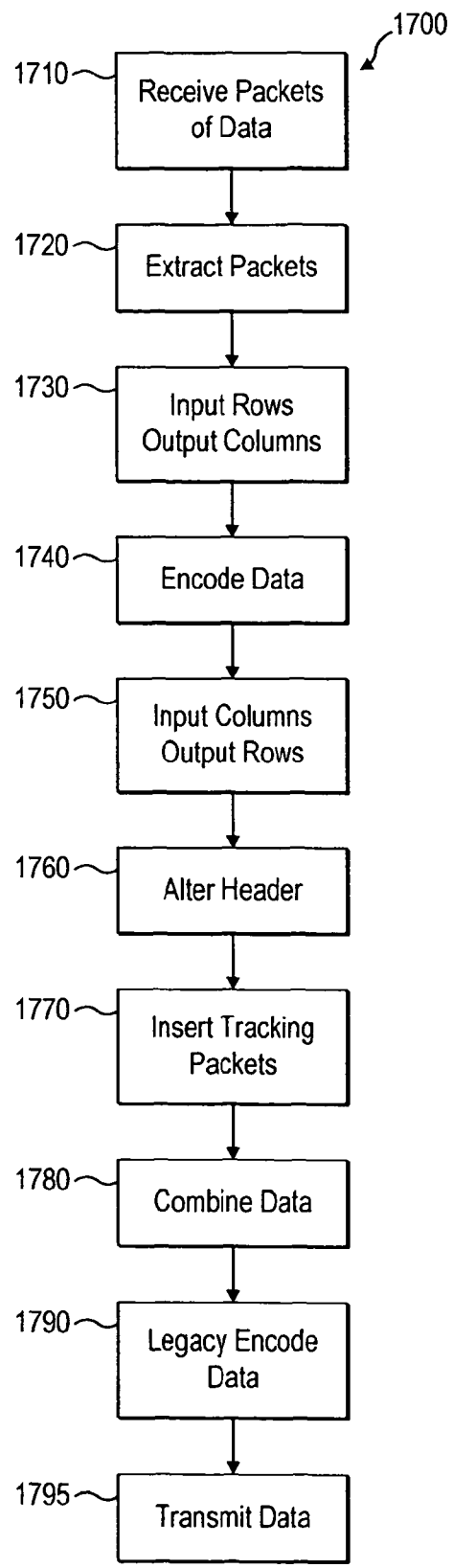
FIG. 17 is a flow chart of another embodiment of an encoding process of the present disclosure.

Turning now to FIG. 17, a flow chart showing another embodiment of an encoding process 1700 is shown. Process 1700 illustrates the steps for encoding and transmitting an ATSC M/H data stream including systematic and non-systematic or redundant data packets that also complies with the existing or legacy A53 signal format. Process 1700 will be described primarily with reference to encoder 1300 in FIG. 13. As above, process 1700 may be performed using hardware involving discrete processing blocks or an integrated circuit containing some or all of the necessary blocks, using software operating in a microprocessor device, or a combination of both hardware and software. It is important to note that process 1700 may be adapted by removing or rearranging certain steps based on the exact required implementation.

First, at step 1710, a transport stream of packets is received. Each packet contains 187 bytes and includes a header. The header includes a PID as well as other information regarding the packet. Next, at step 1720 the packets identified as used for ATSC M/H packets are separated or extracted. The remaining packets are identified as unprocessed. It is important to note that the ATSC M/H packets may be provided as a separate input transport stream of packets instead of extracted from a combined single transport stream. Additionally, all packets in the transport stream may be identified as ATSC M/H packets. Either of these conditions may eliminate the need for the extraction step 1720. Further, the packets identified as either ATSC M/H or unprocessed may be grouped and the ATSC M/H identified packets may further be identified and grouped by separate encoding code-rates.

Next, at step 1730, the sets or groups of ATSC M/H identified packets are read in or input as rows and output as columns or packet interleaved. The columns of output data are equivalent to codewords with the size of each codeword equal to the size of a group of packets. FIG. 14 and FIG. 15 illustrate the matrices showing the packet interleaving of reading in rows and outputting columns at step 1730. It is important to note that the dimensions of the interleaver used in step 1730 may be changed to, for instance, input columns and output rows or to use any other dimension aspects based on the interleaver implementation. Next, at step 1740, each codeword from step 1730 is block code encoded. The block code encoding at step 1730 is similar to the byte-code encoding in process 1600 and may use either a simple encoding process or a concatenated encoding process. For instance, block code encoding step 1730 may encode the codewords using a rate 1/2 constituent code, a rate 12/26 code, a rate 12/52 code, or a rate 17/26 code.

Next, at step 1750, the set of encoded codewords, are packet-de-interleaved by inputting the codewords as columns and outputting data packets as rows. The input codewords now contain the number of bytes generated by the block code encoding at step 1730. The output packets are reconstituted into packets containing 187 bytes. The non-systematic bytes generated in block code encoding step 1730 constitute additional rows of packets in the encoded stream of data. It is important to note that the dimensions of the de-interleaver used in step 1760 may be changed to, for example. input columns and output rows or to use any other dimension aspects based on the interleaver implementation.

Next, at step 1760, the header bytes in the encoded deinterleaved packets are altered. The altering step at 1760 provides a way to prevent performance issues in receivers not capable of decoding ATSC M/H data packets by preventing the header information from being recognized by a legacy receiver. The altering at step 1760 may include setting the TEI bit, the payload unit start indicator bit, and the transport priority bit to a bit value of '0'. The altering at step 1760 may also include setting the scrambling control and adaptation field bits (2 bits each) to '00'. Altering step 1760 may also include setting the continuity counter, which is 3 bits long, to '000'. Finally, the altering at step 1760 may include setting the PID to a unique and unused value, such as a known value that will ignored by all legacy receivers. It is important to note that the header bytes may be ignored and not processed in encoding step 1640.

At step 1770, predetermined packets or a-priori tracking packets are inserted into the stream of encoded packets including altered header information. The insertion of a-priori tracking packets improves the performance of a receiver capable of receiving ATSC M/H or mobile video encoded signals. It is important to note that the insertion step 1770 may replace existing redundant or non-systematic packets, or may replace a packet that was originally provided at step 1710 as a null packet in the stream of data packets.

At step 1780, the ATSC M/H encoded packets from step 1770 are combined with the unprocessed portion of the transport stream of data. The ATSC M/H encoded packets may be inserted in, or appended to, the previously identified unprocessed portion of the transport stream of data packets. Alternately, the ATSCH M/H encoded packets from step 1770 may be combined with, inserted in, or appended to, a second transport stream that is identified for legacy broadcast reception only. It is important to note that step 1780 may be also removed if all of the packets at step 1710 were identified and processed as ATSC M/H data packets. Next, at step 1790, the complete data stream including all packets, ATSC M/H encoded or not, is processed using the legacy or existing encoding compliant with the A53 standard. The legacy encoding at step 1790 includes Reed-Solomon encoding, randomizing, interleaving, trelling encoding and synchronization insertion. The legacy encoding step 1790 may be performed by blocks such as those shown in legacy encoder 1350.

Last, at step 1795, the fully encoded data stream, including either all or a portion of the stream encoded as ATSC M/H data, is transmitted. The transmission step 1795 may include transmitting using a specifically identified frequency range and may include transmitting using a wired technology, such as co-axial cable, or transmitting over the airwaves electromagnetically. It is important to note that the ATSC M/H data may be transmitted continuously. In this mode, the ATSC M/H systematic packets also serve as the data packets in a legacy receiver. The non-systematic packets would be ignored. However, separate ATSC M/H and legacy data may be transmitted in a manner that the ATSC M/H data is transmitted periodically, or transmitted continuously for short non-contiguous periods of time.

Figure 1:
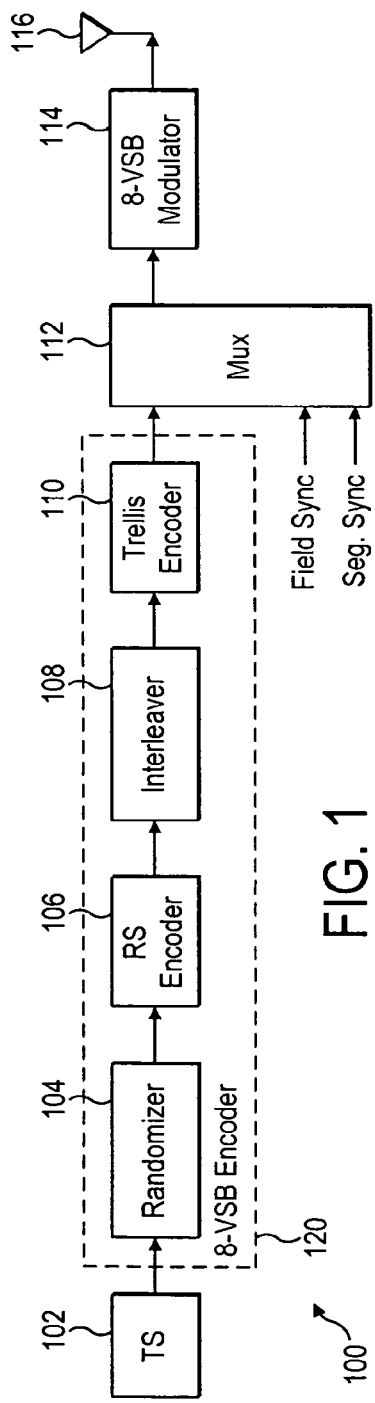
FIG. 1 is a block diagram of a typical transmitting system that transmits a signal compliant with the A53 Standard.
Figures 18, 19:
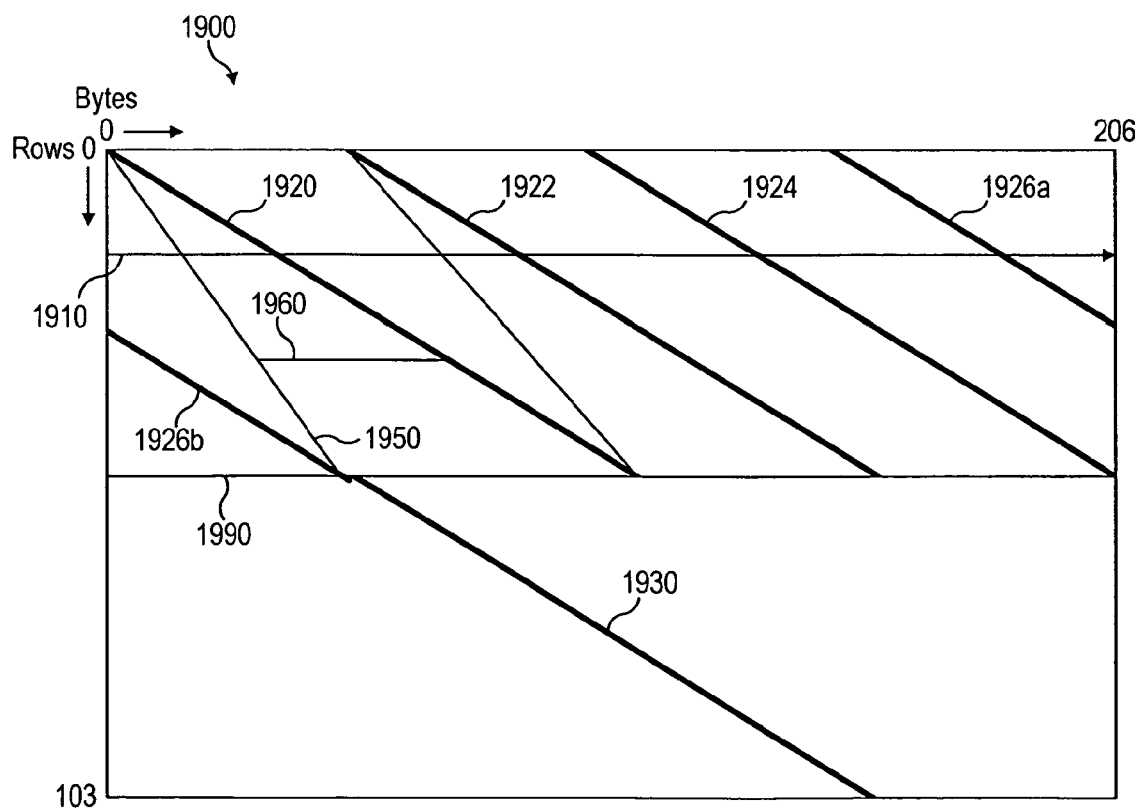
FIG. 18 is a table illustrating the mapping of bits to symbols of the present disclosure.
FIG. 19 is a table illustrating the mapping of bytes in an interleaver of the present disclosure.

Turning to FIG. 18, a table 1800 illustrates the mapping of symbols to bits in a transmission format. Table 1800 shows a mapping of a set of symbols 0-4 representing two bits, Z1 and Z2, of transmitting data. The mapping may be transmitted by modulating a signal amplitude corresponding to each symbol as a 4-PAM signal. The voltage or amplitude difference between the two values or states, as an average, for the most significant bit (Z2) of the symbol is significantly larger than the voltage or amplitude difference between the two values or states for the least significant bit (Z1) of the symbol. As a result, when a signal corresponding to a particular symbol is transmitted through a noisy transmission channel, the probability of correctly estimating the Z2 bit in a receiver is greater than the probability of correctly estimating the Z1 bit. Transmitting a data symbol and a second symbol that is a cyclic rotation of the data symbol can produce a code that can significantly increase the probability of correctly recovering both the Z1 and Z2 bits of the transmitted symbol. Values of element $b_i$ of the Galois Field used in the equations (1) through (27) and the generator matrices used in equations (28) and (29) above may be selected to cyclically rotate (and/or wrap) the bits of the bytes that comprise a packet and thus further improve the ruggedness of the data stream generated by byte-code encoders that use such equations. The selection of cyclical rotation may produce a result that is modified from a simple cyclical rotation when the last bit in the byte is wrapped around to the first byte based on the specific properties of the Galois Field. It is important to note that additional processing by a trellis encoder such as shown in FIG. 1 will add further redundant information to the transmitted signal while not significantly affecting the original bit to symbol mapping. The trellis encoding and additional signal filtering will result in converting the 4-PAM signal described here to an 8-VSB signal as described in the A53 standard.

Turning to FIG. 19, a diagram illustrating an interleaver map 1900 of bytes processed in a convolutional interleaver is shown. The interleaver map 1900 illustrates the organization of incoming bytes of data during processing of a convolutional interleaver, such as interleaver 1356 used in an ATSC legacy encoder 1350 in FIG. 13. Although, interleaver 1356 may be implemented using a series of delay lines, the interleaver map 1900 may be considered a memory map for the interleaver. Interleaver map 1900 indicates the location of input bytes that are placed or written in and how output bytes are read out. The dimensions of interleaver map 1900 are indicated as bytes across the top, numbered from 0 to 206, and rows along the side from top to bottom, numbered from 0 to 103. Line 1910 indicates the order that bytes are read out. For instance, if line 1910 represents row 20, then all of the bytes in row 20 would be read out, starting with byte 0 and finishing with byte 206. When the last byte. Byte 206, is read out from row 20, the reading advances one row, to row 21, until the last row of the interleaver has been read out. When the last row is read out, the reading begins over with reading the first row (with new packet data).

Line 1920 illustrates the location of the first 52 bytes of a first packet of 207 byte code encoded and Reed-Solomon bytes, based on reading in those bytes to the interleaver. Line 1920 starts with the location of byte 0 in the packet and terminates at a center line 1990 with the location of byte 51. Lines 1922, 1924, 1926a, and 1926b show the location of the remaining bytes in the first packet. Line 1922 starts with the location of byte 52 at the top of the line, and so on, and processes with byte locations for each of lines 1922, 1924, and 1926a. The remaining portion of bytes are located along line 1926b and terminates with byte 206 at a location in a row one row below line 1990. The location of bytes in successive packets continues to the right of the locations for the first packet and then process to the portion of the map below line 1990 mirroring the procession and locations above line 1990. For instance, line 1930 shows the location of a portion of the bytes for a fifty-second packet (i.e. a packet input 52 packets after the first packet) in the interleaver. Line 1950 illustrates a boundary line for the transmission of a grouping of packets. With each successive packet, the next successive byte from that packet falls on the boundary line. As a result, line 1950 represents the packet 0 byte 0 location, followed by the packet 1 byte 1 location, and so on, to the packet 52 byte 52 location. Line 1960 illustrates the location of bytes in one row between line 1950 and line 1920. In particular, line 1960 shows the location of a group of bytes that are bytes from column 26 of a set of packets oriented in rows, as shown in FIG. 14. The bytes in the following row contain byte 27 of a portion of the set of packets. Line 1960 illustrates and advantage of encoding the data using the byte-code encoding process described above because the byte code encoded bytes will be output in groups for a short continuous period of time from the interleaver and transmitted.

It is important to note that certain arrangements of sets of packets may provide more optimal transmission arrangements of a robust data stream. The arrangement of the robust data stream may be important if the robust data stream is not continuously transmitted (i.e part of the data stream is legacy data). For instance, a set of 52 packets, as illustrated in FIG. 19, results in a transmission characteristic that includes transmitting robust data in a manner that may easily be predicted and identified using a de-interleaving process in a receiving system.

Figure 20:
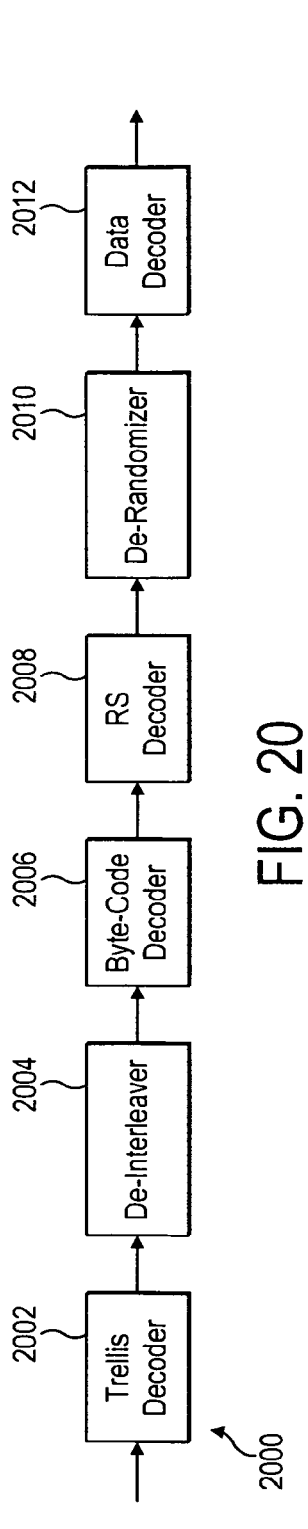
FIG. 20 is a block diagram of an embodiment of a decoder of the present disclosure.

Turning now to FIG. 20, a block diagram of an embodiment of a decoder 2000 used in a receiver system is shown. Decoder 2000 includes circuitry that is adapted to use redundant packets, such as the non-systematic packets in a data stream as described above, to aid in decoding data received by the receiver. Decoder 2000 is also generally capable of decoding data that has been encoded using the legacy or existing A53 standard.

In decoder 2000, following initial tuning, demodulation, and processing by other circuits (not shown) a trellis decoder 2002 receives the incoming signal. The trellis decoder 2002 is connected to a convolutional de-interleaver 2004. The output of the convolutional de-interleaver 2004 is connected to a byte-code decoder 2006. The byte-code decoder 2006 has an output that is connected both to a Reed-Solomon decoder 2008. The output of the Reed-Solomon decoder 2008 is connected to a de-randomizer 2010. The de-randominzer 2010 output is connected to a data decoder 2012. The data decoder 2012 provides an output signal for use in the remaining portion of the receiver system such as video display or audio reproduction. The trellis decoder 2002, de-interleaver 2004, Reed-Solomon decoder 2008, de-randomizer 2010 and data decoder 2012 are similar in function to blocks described in FIG. 2 and will not be further described in detail here.

The received data, in the form of bytes of data in data packets, is decoded by trellis decoder 2002 and de-interleaved by de-interleaver 2004. The data packets may include 207 bytes of data and further may be grouped in groups or 24, 26, or 52 packets. The trellis decoder 2002 and de-interleaver 2004 are capable of processing incoming legacy format data as well as byte-code encoded data. Based on a predetermined packet transmission sequence that is also known by the receiver, the byte-code decoder 2006 determines if the packet is a packet included in a byte-code encoded or robust data stream. If the received packet is not from the byte-code encoded data stream then the received packet is provided to the Reed-Solomon decoder 2008 without any further processing in byte-code decoder 2006. Byte code decoder 2006 may also include a de-randomizer that removes the known sequence of constants multiplied by or added to the data stream during encoding. It is important to note that a rugged data stream includes both systematic packets and bytes that are identical to the original data and non-systematic packets and bytes that contain redundant data.

If the byte-code decoder 2006 determines that the received is a byte-code encoded packet belonging to robust or rugged data stream, the packet may be decoded along with other packets comprising the same data stream. In one embodiment, byte-code encoded packets of the same data stream are decoded by multiplying each byte within the packet by the inverse of the value of the b element that was used to develop the byte-coded packet as shown in equation (2) above. The decoded values of the bytes of the non-systematic packet are compared to the values of the bytes of the systematic packet and the values of any bytes in the two packets that are not identical may be erased (i.e., set to zero) in the systematic packet or may be replaced by the information in the non-systematic packet. The systematic packet with error bytes erased may thereafter be decoded using Reed-Solomon decoding performed in Reed-Solomon decoder 2008. Further description of other embodiments of byte-code decoders will be discussed below.

Byte code decoder 2006 may also be adapted to operate as a block coder for decoding signals encoded as shown in FIG.

13. For instance, byte code decoder 2006 may include a packet interleaver similar to packet interleaver 1312 and a packet deinterleaver similar to packet deinterleaver 1316. Additionally, the byte code encoder function may be adapted to decode a GF(256) Serial Concatenated Block Coded (SCBC) signal. The byte code decoder 2006 may further include an identifier block used for identifying data encoded for mobile or ATSC M/H reception and/or identification of a-priori training packets. Additionally, the identifier block may include a packet identifier block to determine, for example, if the headers in the incoming packets include a PID used for mobile reception.

It is important to note that in a preferred encoder, such as encoder 500 shown in FIG. 5, byte-code encoding precedes the Reed-Solomon encoding of data packets. However, in decoder 2000 shown here, the incoming data is byte-code decoded before being the Reed-Solomon decoded. The re-ordering is possible because both the byte-code operation and Reed-Solomon code operation are linear over the Galois Field (256) used in the A53 standard, and linear operators are commutative in a Galois Field. The importance of the re-ordering is important because the byte-code encoding provides higher reliability for recovering errors in the received signal. As a result, performing byte-code decoding prior to Reed-Solomon decoding results in improved receiver performance as measured in terms of bit-error rate and signal to noise ratio.

Additionally, as with the description of the embodiments of encoder 500 in FIG. 5 and encoder 1300 in FIG. 13, it should be noted that the byte code decoding elements and process may be added to the elements, components, and circuits needed and used in a legacy receiver with minimal change to the legacy receiver. However, the decoding process may be enhanced by incorporating features of the byte code decoding process into other blocks in the legacy receiver.

Figure 21:
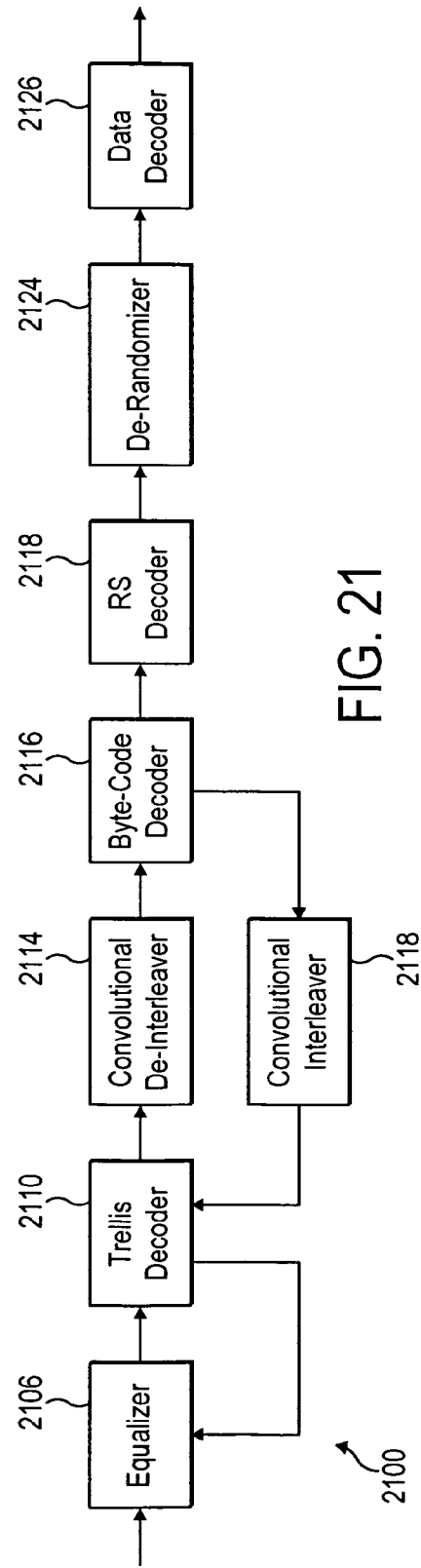
FIG. 21 is a block diagram of another embodiment of a decoder of the present disclosure.

Turning now to FIG. 21, a block diagram of another embodiment of a decoder 2100 used in a receiver is shown. Decoder 2100 includes additional circuitry and processing for receiving and decoding signals that have been adversely affected by transmission of the signal over a transmission medium such as electromagnetic waves over the air. Decoder 2100 is capable of decoding both a rugged data stream as well as a legacy data stream.

In decoder 2100, the incoming signal, following initial processing, is provided to equalizer 2106. Equalizer 2106 is connected to trellis decoder 2110, which provides two outputs. A first output from trellis decoder 2110 provides feedback and is connected back as a feedback input to equalizer 2106. The second output from trellis decoder 2110 is connected to a convolutional de-interleaver 2114. The convolutional de-interleaver 2114 is connected to a byte-code decoder 2116, which also provides two outputs. A first output from byte-code decoder 2116 is connected back as a feedback input to trellis decoder 2110 through a convolutional interleaver 2118. The second output from byte-code decoder 2116 is connected to a Reed-Solomon decoder 2120. The output of the Reed-Solomon decoder 2120 is connected to de-randomizer 2124. The output of the de-randomizer 2124 is connected to a data decoder 2126. Reed-Solomon decoder 2120, de-randomizer 2124, and data decoder 2126 are connected, and functionally operate, in a manner similar to Reed-Solomon, de-randomizer, and data decoder blocks described in FIG. 2 and will not be further described here.

An input signal from the front end processing (e.g. antenna, tuner, demodulator, A/D converter) of the receiver (not shown) is provided to equalizer 2106. Equalizer 2106 processes the received signal to completely or partially remove the transmission channel effect in an attempt to recover the received signal. The various removal or equalization methods are well known to those skilled in the art and will not be discussed here. Equalizer 2106 may include multiple sections of processing circuitry including a feed-forward equalizer (FFE) section and a decision-feedback-equalizer (DFE) section.

The equalized signal is provided to trellis decoder 2110. The trellis decoder 2110 produces, as one output, a set of decision values that are provided to the DFE section of equalizer 2106. The trellis decoder 2110 may also generate intermediate decision values that are also provided to the DFE section of equalizer 2106. The DFE section uses the decision values along with intermediate decision values from the trellis decoder 2110 to adjust values of filter taps in equalizer 2106. The adjusted filter tap values cancel interference and signal reflections that are present in the received signal. The iterative process allows equalizer 2106, with the assistance of feedback from trellis decoder 2110, to dynamically adjust to a potential changing signal transmission environment conditions over time. It is important to note that the iterative process may occur at a rate similar to incoming data rate of the signal, such as 19 Mb/s for a digital television broadcast signal. The iterative process also may occur at a rate higher than the incoming data rate.

The trellis decoder 2110 also provides a trellis decoded data stream to convolutional de-interleaver 2114. Convolutional de-interleaver 2114 operates similar to the de-interleaver described in FIG. 20 generates de-interleaved bytes organized within data packets. The data packets are provided to byte-code decoder 2116. As described above, packets that are not a part of a rugged data stream are simply passed through the byte-code decoder 2116 to Reed-Solomon decoder 2120. If the byte-code decoder 2116 identifies a group of the packets as part of a rugged data stream, the byte-code decoder 2116 uses the redundant information in the non-systematic packets to initially decode the bytes in the packets as described above.

Byte-code decoder 2116 and the trellis decoder 2110 operate in an iterative manner, referred to as a turbo-decoder, to decode the rugged data stream. Specifically, the trellis decoder 2110 provides, after de-interleaving by convolutional de-interleaver 2114, a first soft decision vector to the byte-code decoder 2116 for each byte of the packets that are included in the rugged data stream. Typically, the trellis decoder 2110 produces the soft decision as a vector of probability values. In some embodiments, each probability value in the vector is associated with a value that the byte associated with the vector may have. In other embodiments, the vector of probability values is generated for every half-nibble (i.e., two bits) that is contained in the systematic packet because the 2/3-rate trellis decoder estimates two-bit symbols. In some embodiments the trellis decoder 2110 combines four soft decisions associated with four half-nibbles of a byte to produce one soft-decision that is a vector of the probabilities of values that the byte may have. In such embodiments, the soft-decisions corresponding to the byte is provided to the byte-code decoder 2116. In other embodiments, the byte-code decoder separates a soft-decision regarding a byte of the systematic packet into four soft-decision vectors, wherein each of the four soft-decisions is associated with a half-nibble of the byte.

The byte-code decoder 2116 uses the soft decision vector associated with the bytes comprising packets of the rugged data stream to produce a first estimate of the bytes that comprise the packets. The byte-code decoder 616 uses both the systematic and the non-systematic packets to generate a second soft decision vector for each byte of packets comprising the rugged stream and provides the second soft-decision vector to the trellis decoder 2110, after re-interleaving by convolutional interleaver 2118. The trellis decoder 2110 thereafter uses the second soft-decision vector to produce a further iteration of the first decision vector, which is provided to the byte-code decoder 2116. The trellis decoder 2110 and the byte-code decoder 2116 iterate in this fashion until the soft-decision vector produced by the trellis decoder and byte-code decoder converge or a predetermined number of iterations are undertaken. Thereafter, the byte-code decoder 2116 uses the probability values in the soft-decision vector for each byte of the systematic packets to generate a hard decision for each byte of the systematic packets. The hard decision values (i.e., decoded bytes) are output from the byte-code encoder 2116 to Reed-Solomon decoder 2120. The trellis decoder 2110 may be implemented using a Maximum a Posteriori (MAP) decoder and may operate on either byte or half-nibble (symbol) soft decisions.

It is important to note that turbo-decoding typically utilizes iteration rates related to passing decision data between blocks that are higher than the incoming data rates. The number of possible iterations is limited to the ratio of the data rate and the iteration rate. As a result and to the extent practical, a higher iteration rate in the turbo-decoder generally improves the error correction results. In one embodiment, an iteration rate that is 8 times the incoming data rate may be used.

A soft input soft output byte-code decoder such as described in FIG. 21 may include vector decoding functions. Vector decoding involves grouping bytes of the data including systematic and non-systematic bytes. For example, for a rate 1/2 byte code encoded stream, 1 systematic and 1 non-systematic byte will be grouped. The two bytes have over 64,000 possible values. The vector decoder determines or estimates a probability for each of the possible values of the two bytes and creates a probability map. A soft decision is made based on a weighting the probabilities of some or all of the possibilities and the Euclidean distance to a possible codeword. A hard decision may be made when the error of the Euclidean distance falls below a threshold.

Byte-code decoders, as described in FIGS. 20 and 21 may decode a rugged data stream that has been encoded by the byte-code encoders described earlier, including encoding by simple byte-code encoders or concatenated byte-code encoders. The byte-code decoders in FIGS. 20 and 21 describe decoding a rugged data stream encoded by a simple or constituent byte-code encoder involving only a single encoding step. Concatenated byte-code decoding includes decoding the incoming codewords or bytes in more than one decoding step in addition to intermediate processing such as de-interleaving, de-puncturing, and re-insertion.

Figure 22:
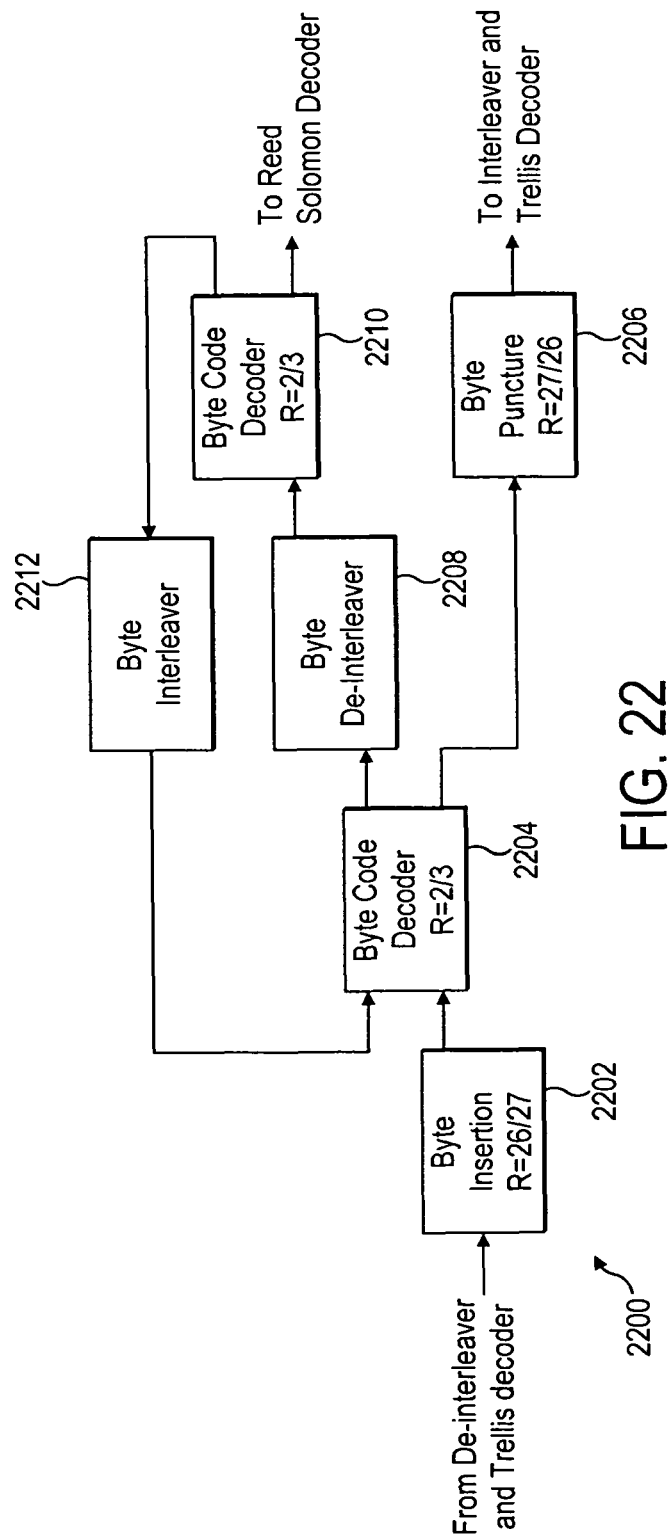
FIG. 22 is a block diagram of an embodiment of a concatenated byte-code decoder of the present disclosure.

Turning now to FIG. 22, a block diagram of an embodiment of a concatenated byte-code decoder 2200 is shown. Concatenated byte-code decoder 2200 is configured to operate in a turbo-decoder configuration such as shown in FIG. 21. Concatenated byte-code decoder 2200 also operates internally as a turbo-decoder using an iterative process to decode concatenated byte-code encoded packets in a rugged data stream. Concatenated byte-code decoder 2200 is adapted to decode a rate 12/26 byte-code encoded signal stream, producing 12 bytes of data from an originally encoded 26 bytes.

The data stream, representing soft decision values of the 26 bytes is provided to a byte insertion block 2202. The output of the byte insertion block 2202 is connected to a first 2/3 rate byte-code decoder 2204. The first 2/3 rate byte-code decoder 2204 provides two outputs. A first output is connected to a puncture block 2206, with the output of the puncture block connected as a feedback input to a trellis decoder through an interleaver as shown in FIG. 21. The second output of the first 2/3 rate byte-code decoder 2204 is connected to a de-interleaver 2208. The output of the symbol de-interleaver 2208 is connected to a second 2/3 rate decoder 2210 also having two outputs. A first output is connected as a feedback input to the first 2/3 rate byte-code decoder 2204 through an interleaver 2212. The second output is connected to other processing blocks such as a Reed-Solomon decoder.

The 26 byte input to byte insertion block 2202 includes the first soft-decisions generated by a trellis decoder, such as trellis decoder 2110 in FIG. 21 regarding the systematic bytes of data or systematic packets and soft-decisions regarding the non-systematic bytes of data or non-systematic packets. The systematic and non-systematic bytes of data may be from packets that have been byte-code encoded. A 2/3 rate byte-code decoder requires 3 bytes in order to decode 2 data bytes. However, the original concatenated encoding removed a byte to reduce the codeword from 27 bytes to 26 bytes by removing, preferably, a non-systematic byte. As a result, a byte is needed to replace the byte removed by the puncturing in the encoding process. Additionally, the trellis decoder does not generate any soft-decisions regarding the punctured byte in the data stream because the input stream to the trellis decoder did not contain the byte. As a result, a soft-decision value is inserted indicating that the value of the punctured byte is equally probable. The first soft-decisions, including the inserted soft-decision value from byte insertion block 2202, are provided to first 2/3 rate byte-code decoder 2204. The first 2/3 rate byte-code decoder 2204 uses the first soft-decisions to generate second soft-decisions based on decoding the bytes of the systematic and non-systematic packets. The generation of the soft decisions utilizes, for instance, the multiplication of a set of bytes by the inverse of the values of the $b_1$ and $b_2$ elements that were used to develop the byte-coded packet as shown in equation (2) and (3) above.

A 27 byte soft output from first 2/3 rate byte-code decoder is provided to puncture block 2206. The 27 byte soft output represents an updated set of soft decision values for both the systematic and non-systematic bytes following the decoding in the first 2/3 rate byte-code decoder. Puncture block 2206 removes the previously inserted soft decision byte in order to return the byte format to the 26 byte format originally processed by the trellis decoder.

An 18 byte soft output from the first 2/3 rate byte-code decoder representing only systematic bytes is provided to de-interleaver 2208. De-interleaver 2208 deinterleaves the 18 bytes of data in a manner reversing the interleaving that was performed in the 2/3 rate byte-code encoding process. De-interleaver 2206 exactly reverses the interleaving map in the encoder by, for instance, reversing rows 710 and 720 in FIG. 7.

The de-interleaved bytes are provided to the second 2/3 rate byte-code decoder 2210. The second 2/3 rate byte-code decoder 2210 uses the de-interleaved soft decision systematic bytes to generate two additional outputs of soft decision bytes in a manner similar to that described above. An 18 byte soft output is provided to interleaver 2212. The 18 byte soft output represents an updated set of soft decision values for both the systematic and non-systematic bytes from the decoding in the first 2/3 rate byte-code decoder 2204. Interleaver 2212 re-interleaves the de-interleaved bytes in order to place them back into the byte format used by the first 2/3 rate byte-code decoder. Interleaver 2212 is essentially identical to the interleaver used in an encoder, such as interleaver 604 in FIG. 6 and provides a re-interleaved set of 18 bytes to the first 2/3 byte-code decoder 2204. The re-interleaved set of 18 bytes are used to improve soft decisions made by the first 2/3 rate byte-code decoder 2204.

A 12 byte output from the second 2/3 rate byte-code decoder 2210 represents the systematic bytes decoded data output for a 12/26 rate byte-code encoded rugged data stream. If the soft-decisions for the 12 systematic output bytes generated by the second 2/3 rate byte-code decoder 2210 are conclusive or within a predetermined threshold of being conclusive as correct data values, then the second 2/3 rate byte-code decoder 2210 uses the soft-decisions to generate hard-decisions regarding the 12 output bytes and provides the 12 output bytes to further processing blocks such as a Reed-Solomon decoder. However, if the soft-decisions generated by the second 2/3 rate byte-code decoder are not conclusive, further iterations are developed as above, using soft information developed and fed back during the previous iteration. This additional soft information is provided to each soft decoder by its succeeding decoder. That is, a trellis decoder uses feedback from first 2/3 rate byte-code decoder 2204 provided through puncture block 2206, and first 2/3 rate byte-code decoder 2204 uses feedback from the second 2/3 rate byte-code decoder 2210 provided through interleaver 2212. The iterations continue in this manner until the soft decisions generated by the second 2/3 rate byte-code decoder 2210 sufficiently converge or until a predetermined number of iterations has been undertaken. As above, the turbo-decoding used in typically utilizes iteration rates related to passing decision data between blocks that are higher than the incoming data rates.

Figure 23:
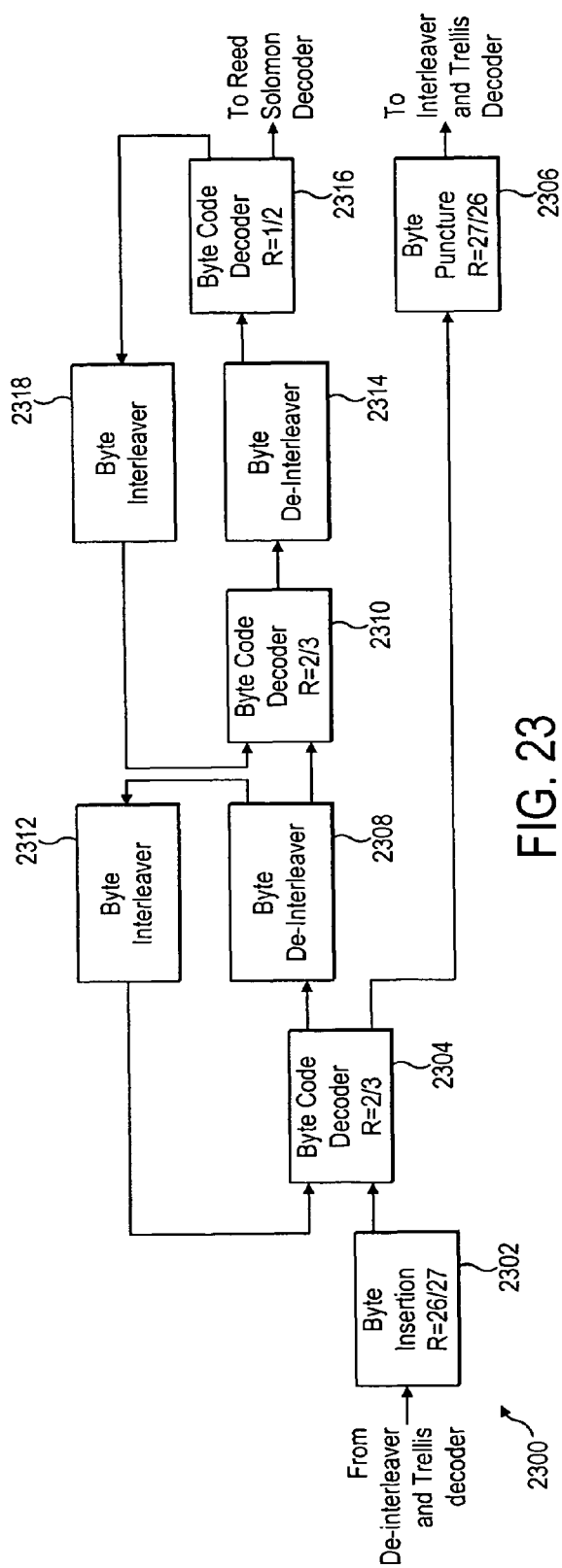
FIG. 23 is a block diagram of another embodiment of a concatenated byte-code decoder of the present disclosure.

Turning now to FIG. 23, a block diagram of another embodiment of a concatenated byte-code decoder 2300 is shown. Concatenated byte-code decoder 2300 is similarly configured to operate in a turbo-decoder configuration such as shown in FIG. 21. Concatenated byte-code decoder 2300 also operates internally as a turbo-decoder using an iterative process involving three constituent byte-code decoders to decode concatenated byte-code encoded packets in a rugged data stream. Concatenated byte-code decoder 2300 is adapted to decode a rate 12/52 block code encoded signal stream, producing 12 bytes of data from an originally encoded 52 bytes.

The data stream, representing soft decision values of the 52 bytes is provided to a packet insertion block 2302. The output of the packet insertion block 2302 is connected to a first 2/3 rate byte-code decoder 2304. The first 2/3 rate byte-code decoder 2304 provides two outputs. A first output is connected to a puncture block 2306, with the output of the puncture block connected as a feedback input to a trellis decoder through an interleaver, not shown. The second output of the first 2/3 rate byte-code decoder 2304 is connected to a first de-interleaver 2308. The output of the first de-interleaver 2308 is connected to a second 2/3 rate byte-code decoder 2310 also having two outputs. A first output is connected as a feedback input to the first 2/3 rate byte-code decoder 2304 through a first interleaver 2312. The second output is connected to a second de-interleaver 2314. The output of the second de-interleaver 2314 is connected to a 1/2 rate byte-code decoder 2316, which also has two outputs. A first output is connected as a feedback input to the second 2/3 rate byte-code decoder 2310 through second interleaver 2318. The second output is connected to other processing blocks such as a Reed-Solomon decoder.

The 52 byte input including the first soft-decisions from the trellis decoder is provided to packet insertion block 2302. Packet insertion block 2302 separates the 52 bytes into two sets of 26 bytes. The separation is performed in order to match the separation performed during byte-code encoding by an encoder such as encoder 900 in FIG. 9. Packet insertion block 2302 inserts a soft-decision byte with an indicated equal probability value, as described above, in each set of 26 bytes to create two sets of 27 bytes. The two sets of 27 bytes remain linked in the processing in order to allow for re-combining the sets in a further byte-code decoding stage. The first 2/3 rate byte-code decoder 2304, first de-interleaver 2308, and first interleaver 2310 operate in a manner similar to that described in FIG. 22 except that they process and maintain the link between the two sets of 27 soft-decision bytes and subsequent two sets of 18 soft-decision bytes at the output of the first 2/3 rate byte-code decoder. The puncture block 2306 removes the previously inserted soft-decision bytes from the two sets of 27 soft output bytes and concatenates the two sets together. The concatenation is necessary in order to return the byte format to the 52 byte format originally processed by the trellis decoder. The two 27 byte soft output sets provided to puncture block 2306 represents an updated set of soft decision values for both the systematic and non-systematic bytes following the decoding in the first 2/3 rate byte-code decoder.

The second 2/3 rate byte-code decoder 2310 processes the 2 sets of 18 bytes as described but concatenates the 2 sets of 12 bytes representing the systematic bytes of decoded data to form a 24 byte soft-decision output. The 24 byte soft-decision output is provided to the second de-interleaver 2314. Second de-interleaver 2314 de-interleaves the 24 bytes of data in a manner reversing the interleaving that was performed in the interleaver 1004 as part of the encoding process described in FIG. 10. Second de-interleaver 2314 reverses the interleaving map in an encoder by, for instance, reversing rows 1110 and 1120 in FIG. 11.

The de-interleaved 24 soft-decision bytes are provided to a 1/2 rate byte-code decoder 2316. The 1/2 rate byte-code decoder 2316 uses the de-interleaved soft decision systematic bytes to generate two additional outputs of soft decision bytes in a manner similar to that described above. A 24 byte soft output is provided to second interleaver 2318. The 24 byte soft output represents an updated set of soft decision values for both the systematic and non-systematic bytes from the decoding in 1/2 rate byte-code decoder. Interleaver 2318 re-interleaves the de-interleaved bytes in order to place them back into the format used by the second 2/3 rate byte-code decoder 2310. Interleaver 2318 is essentially identical to the interleaver used in an encoder, such as interleaver 604 in FIG. 6 and provides the re-interleaved set of 24 bytes to the second 2/3 byte-code decoder 2310. The re-interleaved set of 24 bytes are used to improve soft decisions made by the second 2/3 rate byte-code decoder 2310.

As described above, if the soft-decisions regarding the 12 systematic bytes at the output of the 1/2 rate byte-code decoder 2316 are conclusive or within a predetermined threshold of being conclusive as correct data values, then the 1/2 rate byte-code decoder 2316 uses the soft-decisions to generate hard-decisions regarding the 12 output bytes and provides the 12 output bytes to further processing blocks such as decoding in a Reed-Solomon decoder. However, if the soft-decisions generated by the 1/2 rate byte-code decoder 2316 are not conclusive, further iterations are developed using soft information developed and fed back during the previous iteration. This additional soft information is provided to each soft decoder by its succeeding decoder. That is, a trellis decoder uses feedback from first 2/3 rate byte-code decoder 2304 provided through puncture block 2306, first 2/3 rate byte-code decoder 2304 uses feedback from the second 2/3 rate byte-code decoder 2310 provided through first interleaver 2312, and second 2/3 rate byte-code decoder 2304 uses feedback from 1/2 rate byte-code decoder 2316 provided through second interleaver 2318. The iterations continue in this manner until the soft decisions generated by the 1/2 rate byte-code decoder 2316 sufficiently converge or until a predetermined number of iterations has been undertaken. As above, the turbo-decoding used in typically utilizes iteration rates related to passing decision data between blocks that are higher than the incoming data rates.

Figure 24:
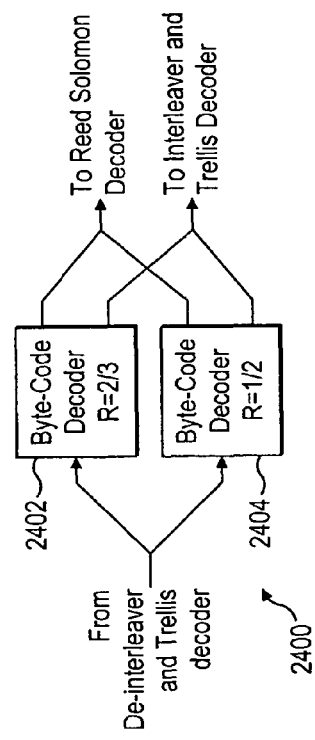
FIG. 24 is a block diagram of a further embodiment of a concatenated byte-code decoder of the present disclosure.

Turning to FIG. 24, a block diagram of another embodiment of a concatenated byte-code decoder 2400 is shown. Concatenated byte-code decoder 2400 is similarly configured to operate in a turbo-decoder configuration such as shown in FIG. 21. Concatenated byte-code decoder 2400 includes two constituent byte-code decoders, a 2/3 rate decoder 2402 and a 1/2 rate decoder 2402, connected and operating in parallel to byte-code encoded packets in a rugged data stream. Concatenated byte-code decoder 2400 is adapted to decode a rate 17/26 byte-code encoded signal stream, producing 17 bytes of data from an originally encoded 26 bytes.

An incoming data stream of soft decision values for 26 bytes from the trellis decoder is separated into a first group of 24 bytes and a second group of 2 bytes. The separation is performed based on the arrangement for the combining of the groups of bytes by the encoder, such as encoder 1200 in FIG. 12, and is generally known to the receiving device. The separation may be performed using a signal or packet multiplexer, not shown. Alternately, the separation and grouping may be performed within each byte-code encoder by, for example, counting incoming bytes to select which bytes to process. The first group of 24 soft decision bytes is decoded by the 2/3-rate byte-code decoder 2402 as described above. The second group of 2 soft decision bytes is similarly decoder by the 1/2-rate byte-code decoder 2404 as described above.

A 24 byte soft output representing an updated set of soft decision values for both the systematic and non-systematic bytes from the decoding in the 2/3 rate byte-code decoder 2402 and a 2 byte soft output representing an updated set of soft decision values for both the systematic and non-systematic bytes from the decoding in the 1/2 rate byte-code decoder 2404 are concatenated to form a 26 byte soft output. The 26 byte soft output is provided to the trellis decoder to potentially improve the soft value decisions for the bytes during the next turbo-decoder iteration.

Similarly, the 16 byte soft output containing systematic bytes from the 2/3 rate byte-code decoder 2402 and the 1 byte soft output containing the systematic byte from the 1/2 rate byte-code decoder 2404 are concatenated to form a 17 byte soft output. if the soft-decisions regarding the 17 systematic bytes are conclusive or within a predetermined threshold of being conclusive as correct data values, then the 2/3 rate byte-code decoder 2402 and 1/2 rate byte-code decoder 2402 use the soft-decisions to generate hard-decisions regarding the 17 output bytes and provides the 17 output bytes to further processing blocks such as Reed-Solomon decoder.

However, if the soft-decisions for the 17 output bytes are not conclusive, further iterations are developed using soft information developed and fed back during the previous iteration. This additional soft information is provided to each soft decoder by its succeeding decoder. That is, a trellis decoder uses feedback from concatenated outputs of the 2/3 rate byte-code decoder 2402 and 1/2 rate byte-code decoder 2404. The iterations continue in this manner until the soft decisions sufficiently converge or until a predetermined number of iterations have been undertaken. As above, the turbo-decoding used in typically utilizes iteration rates related to passing decision data between blocks that are higher than the incoming data rates.

It is important to note that the byte-code decoders described in FIGS. 20-24 may also be configured to decode data encoded using serial concatenated block code encoded by GF(256) SCBC described in FIG. 13.

The various systems using arrangements of byte-code encoding and decoding described above allow an expansion of the applications of the existing or legacy broadcast system. First, existing legacy receivers may benefit from the additional presence of packets encoded using ATSC M/H. The more robust SCBC encoded packets and the a-priori tracking packets may be processed by the trellis decoder and equalizer to improve tracking in dynamic signal environment conditions. Second, the ATSC M/H encoded data that creates a robust or rugged data that allow receiving systems in mobile, handheld, and pedestrian devices to receive the robust stream in signal environments that the legacy A53 transmission cannot be received. For instance, ATSC M/H encoding at rate 12/52 allows signal reception at a white noise threshold equal to 3.5 decibels (dB) as compared a white noise threshold of around 15 dB for legacy A53 reception. Operation is further enhanced by generating the ATSC M/H packets and transmitting the packets in a periodic manner along with the legacy A53 data. The periodic transmission is important to permit video and audio delivery of broadcast material. The ATSC M/H packets may also be grouped and transmitted as a one or more transmission bursts. Transmission in bursts is important for delivery of data content or content that may be stored for later use by the mobile, handheld, or pedestrian device.

While the embodiments may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents and alternatives falling within the spirit and scope of the disclosure as defined by the following appended claims.

What is claimed is:

1. A method comprising the steps of: receiving a packet of data, the packet having a data payload and a header, the header containing information identifying the packet as capable of being received by a first type of receiver; byte code encoding the data in the packet; altering information in the header in response to the byte code encoding, the altered information in the header identifying the packet as a packet that is not recognized by the first type of receiver but capable of being received by a second type of receiver; and combining the byte code encoded packet of data including the header with the altered information with a second packet of data including a header containing information identifying the second packet as capable of being received by the first type of receiver.

2. The method of claim 1, wherein the step of altering includes altering a program identifier in the header.

3. The method of claim 2, wherein the step of altering includes setting the program identifier to a value that is unused in a legacy program map table.

4. The method of claim 3, wherein the step of altering includes setting the program identifier to a value for a valid mobile broadcast packet.

5. The method of claim 1, wherein the step of byte code encoding uses a Galois Field generator matrix to supplement the data in the packet.

6. The method of claim 1 wherein the packet in the step of receiving contains 184 bytes of data in the data payload and 3 bytes of data in the header.

7. The method of claim 1, wherein the step of byte code encoding (1740) uses a GF Serial Concatenated Block Coding process.

8. The method of claim 1, wherein the step of byte code encoding includes byte code encoding only the data payload portion of the packet.

9. The method of claim 1, further comprising the step of Reed-Solomon encoding the byte code encoded data including the altered header.

10. The method of claim 1, wherein the method is used in a television broadcast system.

11. The method of claim 1, wherein the first type of receiver is a legacy broadcast receiver and the second type of receiver is a mobile receiver.

* * * * *